(12) United States Patent
Lochtefeld et al.

(10) Patent No.: US 7,626,246 B2
(45) Date of Patent: Dec. 1, 2009

(54) SOLUTIONS FOR INTEGRATED CIRCUIT INTEGRATION OF ALTERNATIVE ACTIVE AREA MATERIALS

(75) Inventors: Anthony J. Lochtefeld, Somerville, MA (US); Matthew T. Currie, Brookline, MA (US); Zhi-Yuan Cheng, Lincoln, MA (US); James Fiorenza, Wilmington, MA (US)

(73) Assignee: Amberwave Systems Corporation, Salem, NH (US)

( * ) Notice: Subject to any disclaimer, the term of this patent is extended or adjusted under 35 U.S.C. 154(b) by 67 days.

(21) Appl. No.: 11/493,365

(22) Filed: Jul. 26, 2006

(65) Prior Publication Data
US 2007/0181977 A1  Aug. 9, 2007

Related U.S. Application Data

(60) Provisional application No. 60/702,363, filed on Jul. 26, 2005.

(51) Int. Cl.
*H01L 23/58* (2006.01)
(52) U.S. Cl. .................. 257/647; 257/510; 257/618; 257/E29.02
(58) Field of Classification Search .......... 257/501, 257/510, 374, 618, 622; 438/197
See application file for complete search history.

(56) References Cited

U.S. PATENT DOCUMENTS

| | | | |
|---|---|---|---|
| 4,545,109 A | 10/1985 | Reichert | |
| 4,551,394 A | 11/1985 | Betsch et al. | |
| 4,651,179 A | 3/1987 | Reichert | |
| 4,727,047 A | 2/1988 | Bozler et al. | |
| 4,774,205 A | 9/1988 | Choi et al. | |
| 4,789,643 A | 12/1988 | Kajikawa et al. | |
| 4,826,784 A | 5/1989 | Salerno et al. | |
| 4,860,081 A | 8/1989 | Cogan | |
| 4,948,456 A | 8/1990 | Schubert | |
| 5,032,893 A | 7/1991 | Fitzgerald et al. | |
| 5,034,337 A | 7/1991 | Mosher et al. | |
| 5,061,644 A | 10/1991 | Yue et al. | |
| 5,091,333 A | 2/1992 | Fan et al. | |
| 5,091,767 A | 2/1992 | Bean et al. | |
| 5,093,699 A | 3/1992 | Weichold et al. | |
| 5,105,247 A | 4/1992 | Cavanaugh | |
| 5,156,995 A | 10/1992 | Fitzgerald, Jr. et al. | |

(Continued)

FOREIGN PATENT DOCUMENTS

DE   103 20 160 A1   8/2004

(Continued)

OTHER PUBLICATIONS

Choi et al., "Monolithic Integration of Si MOSFET's and GaAs MESFET's," Electron Device Letters, v. EDL-7, No. 4 (1986).

(Continued)

*Primary Examiner*—Phat X Cao
*Assistant Examiner*—Nga Doan
(74) *Attorney, Agent, or Firm*—Goodwin Procter LLP

(57) ABSTRACT

Methods of forming areas of alternative material on crystalline semiconductor substrates, and structures formed thereby. Such areas of alternative material are suitable for use as active areas in MOSFETs or other electronic or opto-electronic devices.

14 Claims, 30 Drawing Sheets

U.S. PATENT DOCUMENTS

| | | | |
|---|---|---|---|
| 5,166,767 A | 11/1992 | Kapoor et al. |
| 5,236,546 A | 8/1993 | Mizutani |
| 5,238,869 A | 8/1993 | Shichijo et al. |
| 5,256,594 A | 10/1993 | Wu et al. |
| 5,269,876 A | 12/1993 | Mizutani |
| 5,281,283 A | 1/1994 | Tokunaga et al. |
| 5,285,086 A | 2/1994 | Fitzgerald, Jr. |
| 5,295,150 A | 3/1994 | Vangieson et al. |
| 5,403,751 A | 4/1995 | Nishida et al. |
| 5,417,180 A | 5/1995 | Nakamura et al. |
| 5,427,976 A | 6/1995 | Kohet et al. |
| 5,432,120 A | 7/1995 | Meister et al. |
| 5,438,018 A | 8/1995 | Mori et al. |
| 5,518,953 A | 5/1996 | Takasu |
| 5,589,696 A | 12/1996 | Baba et al. |
| 5,621,227 A | 4/1997 | Joshi |
| 5,640,022 A | 6/1997 | Inai et al. |
| 5,710,436 A | 1/1998 | Tanamoto et al. |
| 5,717,709 A | 2/1998 | Sasaki et al. |
| 5,792,679 A | 8/1998 | Nakato |
| 5,825,049 A | 10/1998 | Simmons et al. |
| 5,849,077 A | 12/1998 | Kenney |
| 5,886,385 A | 3/1999 | Arisumi et al. |
| 5,953,361 A | 9/1999 | Borchert et al. |
| 5,966,620 A | 10/1999 | Sakaguchi et al. |
| 6,011,271 A | 1/2000 | Sakuma et al. |
| 6,015,979 A | 1/2000 | Sugiura et al. |
| 6,049,098 A | 4/2000 | Sato et al. |
| 6,100,106 A | 8/2000 | Yamaguchi et al. |
| 6,111,288 A | 8/2000 | Watanabe et al. |
| 6,191,432 B1 | 2/2001 | Sugiyama et al. |
| 6,228,691 B1 | 5/2001 | Doyle |
| 6,235,547 B1 | 5/2001 | Sakuma et al. |
| 6,252,261 B1 | 6/2001 | Usui et al. |
| 6,271,551 B1 | 8/2001 | Schmitz et al. |
| 6,320,220 B1 | 11/2001 | Watanabe et al. |
| 6,342,404 B1 | 1/2002 | Shibata et al. |
| 6,348,096 B1 | 2/2002 | Sunakawa et al. |
| 6,362,071 B1 | 3/2002 | Nguyen et al. |
| 6,380,590 B1 | 4/2002 | Yu |
| 6,407,425 B1 | 6/2002 | Babcock et al. |
| 6,492,216 B1 | 12/2002 | Yeo et al. |
| 6,512,252 B1 | 1/2003 | Takagi et al. |
| 6,521,514 B1 | 2/2003 | Gehrke et al. |
| 6,576,532 B1 | 6/2003 | Jones et al. |
| 6,579,463 B1 | 6/2003 | Winningham et al. |
| 6,603,172 B1 | 8/2003 | Segawa et al. |
| 6,617,643 B1 | 9/2003 | Goodwin-Johansson |
| 6,635,110 B1 | 10/2003 | Luan et al. |
| 6,686,245 B1 | 2/2004 | Mathew et al. |
| 6,710,368 B2 | 3/2004 | Fisher et al. |
| 6,720,196 B2 | 4/2004 | Kunisato et al. |
| 6,727,523 B2 | 4/2004 | Morita |
| 6,753,555 B2 | 6/2004 | Takagi et al. |
| 6,784,074 B2 | 8/2004 | Shchukin et al. |
| 6,803,598 B1 | 10/2004 | Berger et al. |
| 6,809,351 B2 | 10/2004 | Kuramoto et al. |
| 6,812,495 B2 | 11/2004 | Wada et al. |
| 6,815,241 B2 | 11/2004 | Wang |
| 6,825,534 B2 | 11/2004 | Chen et al. |
| 6,835,246 B2 | 12/2004 | Zaidi |
| 6,841,410 B2 | 1/2005 | Sasaoka |
| 6,841,808 B2 | 1/2005 | Shibata et al. |
| 6,855,990 B2 | 2/2005 | Yeo et al. |
| 6,867,433 B2 | 3/2005 | Yeo et al. |
| 6,873,009 B2 | 3/2005 | Hisamoto et al. |
| 6,887,773 B2 | 5/2005 | Gunn, III et al. |
| 6,900,070 B2 | 5/2005 | Craven et al. |
| 6,902,965 B2 | 6/2005 | Ge et al. |
| 6,917,068 B1 | 7/2005 | Krivokapic |
| 6,919,258 B2 | 7/2005 | Grant et al. |
| 6,920,159 B2 | 7/2005 | Sidorin et al. |
| 6,921,673 B2 | 7/2005 | Kobayashi et al. |
| 6,946,683 B2 | 9/2005 | Sano et al. |
| 6,955,977 B2 | 10/2005 | Kong et al. |
| 6,958,254 B2 | 10/2005 | Seifert |
| 6,960,781 B2 | 11/2005 | Currie et al. |
| 6,982,204 B2 | 1/2006 | Saxler et al. |
| 6,982,435 B2 | 1/2006 | Shibata et al. |
| 6,984,571 B1 | 1/2006 | Enquist |
| 6,991,998 B2 | 1/2006 | Bedell et al. |
| 6,994,751 B2 | 2/2006 | Hata et al. |
| 6,995,430 B2 | 2/2006 | Langdo et al. |
| 6,995,456 B2 | 2/2006 | Nowak |
| 6,998,684 B2 | 2/2006 | Anderson et al. |
| 7,001,804 B2 | 2/2006 | Dietz et al. |
| 7,012,298 B1 | 3/2006 | Krivokapic |
| 7,012,314 B2 | 3/2006 | Bude et al. |
| 7,015,497 B1 | 3/2006 | Berger |
| 7,015,517 B2 | 3/2006 | Grant et al. |
| 7,033,436 B2 | 4/2006 | Biwa et al. |
| 7,033,936 B1 | 4/2006 | Green |
| 7,041,178 B2 | 5/2006 | Tong et al. |
| 7,049,627 B2 | 5/2006 | Vineis et al. |
| 7,074,623 B2 | 7/2006 | Lochtefeld et al. |
| 7,078,731 B2 | 7/2006 | D'Evelyn et al. |
| 7,084,051 B2 | 8/2006 | Ueda |
| 7,084,441 B2 | 8/2006 | Saxler |
| 7,087,965 B2 | 8/2006 | Chan et al. |
| 7,095,043 B2 | 8/2006 | Oda et al. |
| 7,098,508 B2 | 8/2006 | Ieong et al. |
| 7,101,444 B2 | 9/2006 | Shchukin et al. |
| 7,109,516 B2 | 9/2006 | Langdo et al. |
| 7,119,402 B2 | 10/2006 | Kinoshita et al. |
| 7,125,785 B2 | 10/2006 | Cohen et al. |
| 7,128,846 B2 | 10/2006 | Nishijima et al. |
| 7,132,691 B1 | 11/2006 | Tanabe et al. |
| 7,138,292 B2 | 11/2006 | Mirabedini et al. |
| 7,160,753 B2 | 1/2007 | Williams, Jr. |
| 7,195,993 B2 | 3/2007 | Zheleva et al. |
| 7,205,586 B2 | 4/2007 | Takagi et al. |
| 7,211,864 B2 | 5/2007 | Seliskar |
| 7,224,033 B2 | 5/2007 | Zhu et al. |
| 7,244,958 B2 | 7/2007 | Shang et al. |
| 7,247,534 B2 | 7/2007 | Chidambarrao et al. |
| 7,247,912 B2 | 7/2007 | Zhu et al. |
| 7,250,359 B2 | 7/2007 | Fitzgerald |
| 7,262,117 B1 | 8/2007 | Gunn, III et al. |
| 7,268,058 B2 | 9/2007 | Chau et al. |
| 2001/0006249 A1 | 7/2001 | Fitzgerald |
| 2001/0045604 A1 | 11/2001 | Oda et al. |
| 2002/0030246 A1 | 3/2002 | Eisenbeiser et al. |
| 2002/0066403 A1 | 6/2002 | Sunakawa |
| 2003/0045017 A1 | 3/2003 | Hiramatsu et al. |
| 2003/0064535 A1 | 4/2003 | Kub et al. |
| 2003/0087462 A1 | 5/2003 | Koide et al. |
| 2003/0089899 A1 | 5/2003 | Lieber et al. |
| 2003/0155586 A1 | 8/2003 | Koide et al. |
| 2003/0203531 A1 | 10/2003 | Shchukin et al. |
| 2003/0207518 A1 | 11/2003 | Kong et al. |
| 2004/0012037 A1 | 1/2004 | Venkatesan et al. |
| 2004/0031979 A1 | 2/2004 | Lochtefeld et al. |
| 2004/0072410 A1 | 4/2004 | Motoki et al. |
| 2004/0075105 A1 | 4/2004 | Leitz et al. |
| 2004/0150001 A1 | 8/2004 | Shchukin et al. |
| 2004/0173812 A1 | 9/2004 | Currie et al. |
| 2005/0003572 A1 | 1/2005 | Hahn et al. |
| 2005/0045983 A1* | 3/2005 | Noda et al. .................. 257/500 |
| 2005/0054180 A1 | 3/2005 | Han |
| 2005/0056892 A1 | 3/2005 | Seliskar |
| 2005/0073028 A1 | 4/2005 | Grant et al. |
| 2005/0093021 A1* | 5/2005 | Ouyang et al. ............... 257/194 |
| 2005/0104156 A1 | 5/2005 | Wasshuber |
| 2005/0118825 A1 | 6/2005 | Nishijima et al. |

| | | | |
|---|---|---|---|
| 2005/0145941 | A1 | 7/2005 | Bedell et al. |
| 2005/0145954 | A1 | 7/2005 | Zhu et al. |
| 2005/0164475 | A1 | 7/2005 | Peckerar et al. |
| 2005/0181549 | A1 | 8/2005 | Barr et al. |
| 2005/0184302 | A1 | 8/2005 | Kobayashi et al. |
| 2005/0205859 | A1 | 9/2005 | Currie et al. |
| 2005/0205932 | A1 | 9/2005 | Cohen |
| 2005/0212051 | A1 | 9/2005 | Jozwiak et al. |
| 2005/0217565 | A1 | 10/2005 | Lahreche et al. |
| 2005/0280103 | A1 | 12/2005 | Langdo et al. |
| 2006/0009012 | A1 | 1/2006 | Leitz et al. |
| 2006/0019462 | A1 | 1/2006 | Cheng et al. |
| 2006/0049409 | A1 | 3/2006 | Rafferty et al. |
| 2006/0105533 | A1* | 5/2006 | Chong et al. ............... 438/322 |
| 2006/0113603 | A1 | 6/2006 | Currie |
| 2006/0128124 | A1 | 6/2006 | Haskell et al. |
| 2006/0131606 | A1 | 6/2006 | Cheng |
| 2006/0145264 | A1 | 7/2006 | Chidambarrao et al. |
| 2006/0160291 | A1 | 7/2006 | Lee et al. |
| 2006/0166437 | A1* | 7/2006 | Korber ..................... 438/257 |
| 2006/0175601 | A1 | 8/2006 | Lieber et al. |
| 2006/0186510 | A1 | 8/2006 | Lochtefeld et al. |
| 2006/0189056 | A1* | 8/2006 | Ko et al. ..................... 438/197 |
| 2006/0197123 | A1 | 9/2006 | Lochtefeld et al. |
| 2006/0197124 | A1 | 9/2006 | Lochtefeld et al. |
| 2006/0197126 | A1 | 9/2006 | Lochtefeld et al. |
| 2006/0202276 | A1 | 9/2006 | Kato |
| 2006/0205197 | A1 | 9/2006 | Yi et al. |
| 2006/0211210 | A1 | 9/2006 | Bhat et al. |
| 2006/0267047 | A1 | 11/2006 | Murayama |
| 2006/0292719 | A1 | 12/2006 | Lochtefeld et al. |
| 2007/0029643 | A1 | 2/2007 | Johnson et al. |
| 2007/0054465 | A1 | 3/2007 | Currie et al. |
| 2007/0054467 | A1 | 3/2007 | Currie et al. |
| 2007/0105256 | A1 | 5/2007 | Fitzgerald |
| 2007/0105274 | A1 | 5/2007 | Fitzgerald |
| 2007/0105335 | A1 | 5/2007 | Fitzgerald |
| 2007/0187668 | A1 | 8/2007 | Noguchi et al. |
| 2007/0196987 | A1 | 8/2007 | Chidambarrao et al. |
| 2007/0267722 | A1 | 11/2007 | Lochtefeld et al. |
| 2008/0001169 | A1 | 1/2008 | Lochtefeld |
| 2008/0070355 | A1 | 3/2008 | Lochtefeld et al. |
| 2008/0073641 | A1 | 3/2008 | Cheng et al. |
| 2008/0073667 | A1 | 3/2008 | Lochtefeld |
| 2008/0093622 | A1 | 4/2008 | Li et al. |
| 2008/0099785 | A1 | 5/2008 | Bai et al. |
| 2008/0187018 | A1 | 8/2008 | Li |
| 2009/0039361 | A1 | 2/2009 | Li et al. |
| 2009/0065047 | A1 | 3/2009 | Fiorenza et al. |

FOREIGN PATENT DOCUMENTS

| | | |
|---|---|---|
| EP | 1551063 | 7/2005 |
| EP | 1796180 | 6/2007 |
| JP | 02062090 | 3/1990 |
| JP | 2000/286449 | 10/2000 |
| JP | 2004/200375 | 7/2004 |
| WO | WO-02/086952 | 10/2002 |
| WO | WO-2004/023536 | 3/2004 |
| WO | WO-2005/048330 | 5/2005 |
| WO | WO-2005/098963 | 10/2005 |
| WO | WO 2005/122267 A2 | 12/2005 |
| WO | WO-2006/125040 | 11/2006 |

OTHER PUBLICATIONS

Choi et al., "Monolithic Integration of GaAs/AlGaAs Double-Heterostructure LED's and Si MOSFET's," Electon Device Letters, v. EDL-7, No. 9 (1986).
Choi et al., "Monolithic Integration of GaAs/AlGaAs LED and Si Driver Circuit," 9 Electron Device Letters 10 (1988).
Fiorenza et al., "Film Thickness Constraints for Manufacturable Strained Silicon CMOS," 19 Semiconductor Sci. Technol., pp. L4 (2004).
Hu et al., "Growth of Well-Aligned Carbon Nanotube arrays on Silicon Substrates using Porous Alumina Film as a Nanotemplate," 79 App. Physics Letters 19 (2001).
Shichijo et al., "Co-Integration of GaAs MESFET & Si CMOS Circuits," 9 Elec. Device. Letters 9 (1988).
Bergman et al. "RTD/CMOS Nanoelectronic Circuits: Thin-Film InP-based Resonant Tunneling Diodes Integrated with CMOS circuits," 20 Electron Device Letters 3, pp. 119-122 (1999).
Cloutier et al., "Optical gain and stimulated emission in periodic nanopatterned crystalline silicon," Nature Materials, Nov. 2005.
Feng et al., "Integration of Germanium-on-Insulator and Silicon MOSFET's on a Silicon Substrate," 27 Electron Device Letters 11, pp. 911-913 (2006).
Fischer et al., "Elastic stress relaxation in SiGe epilayers on patterned Si substrates," 75 Journal of Applied Physics 1, pp. 657-659 (1994).
Fischer et al., "State of stress and critical thickness of Strained small-area SiGe layers," Phys. Stat. Sol. (a) 171, pp. 475-485 (1999).
Fitzgerald et al., "Structure and recombination in InGaAs/GaAs heterostructures," 63 Journal of Applied Physics 3, pp. 693-703 (1988).
International Search Report and Written Opinion for International Application No. PCT/U507/022392, mailed Apr. 11, 2008.
International Preliminary Report on Patentability for International Application No. PCT/US2007/020181, mailed Apr. 2, 2009.
Partial International Search Report for International Application No. PCT/US2008/068377, mailed Apr. 7, 2009.
Asano, T.; Tojyo, T.; Yanashima, K.; Takeya, M.; Hino, T.; Ikeda, S.; Kijima, S.; Ansai, S.; Shibuya, K.; Goto, S.; Tomiya, S.; Yabuki, Y.; Aoki, T.; Uchida, S.; Ikeda, M., "AlGaInN laser diodes grown on an ELO-GaN substrate vs. on a sapphire substrate," *Semiconductor Laser Conference, 2000. Conference Digest. 2000 IEEE 17th International*, vol., No. pp. 109-110, 2000.
Ashby, C.I.H.; Willan, C.C.; Jung Han; Missert, N.A.; Provencio, P.P.; Follstaedt, D.M.; Peake, G.M.; Griego, L. Source:"Low-dislocation-density GaN from a single growth on a textured substrate." Applied Physics Letters, v 77, n 20, Nov. 13, 2000, p. 3233-5.
Bakkers et al., "Epitaxial Growth on InP Nanowires on Germanium," *Nature Materials*, vol. 3 (Nov. 2004), pp. 769-773.
Baron et al., "Chemical Vapor Deposition of Ge Nanocrystals on $SiO_2$," *Applied Physics Letters*, vol. 83, No. 7 (Aug. 18, 2003), pp. 1444-1446.
Beltz et al., "A Theoretical Model for Threading Dislocation Reduction During Selective Area Growth," *Materials Science and Engineering*, A234-236 (1997), pp. 794-797.
Borland, J.O., "Novel device structures by selective epitaxial growth (SEG)," *Electron Devices Meeting, 1987 International*, vol. 33, No. pp. 12-15, 1987.
Bryskiewicz, T., "Dislocation filtering in SiGe and InGaAs buffer layers grown by selective lateral overgrowth method," Applied Physics Letters, v 66, n 10, Mar. 6, 1995, p. 1237-9.
Bushroa, A.R.; Jacob, C.; Saijo, H.; Nishino, S. "Lateral epitaxial overgrowth and reduction in defect density of 3C-SiC on patterned Si substrates," Journal of Crystal Growth, v 271, n 1-2, Oct. 15, 2004, p. 200-6.
Cannon et al., "Monolithic Si-based Technology for Optical Receiver Circuits," *Proceedings of SPIE*, vol. 4999 (2003), pp. 145-155.
Chan et al., "Influence of metalorganic Sources on the Composition Uniformity of Selectively Grown $Ga_xIn_{1-x}P$," *Jpn J. Appl. Phys.*, vol. 33 (1994) pp. 4812-4819.
Chang, Y.S.; Naritsuka, S.; Nishinaga, T., "Effect of growth temperature on epitaxial lateral overgrowth of GaAs on Si substrate," Journal of Crystal Growth, v 174, n 1-4, Apr. 1997, p. 630-4.
Chen, Y.; Schneider, R.; Wang, S.Y.; Kern, R.S.; Chen, C.H.; Kuo, C.P., "Dislocation reduction in GaN thin films via lateral overgrowth from trenches," Applied Physics Letters, v 75, n 14, Oct. 4, 1999, p. 2062-3.
Dadgar, A.; Poschenrieder, M.; Blasing, J.; Contreras, O.; Bertram, F.; Riemann, T.; Reiher, A.; Kunze, M.; Daumiller, I.; Krtschil, A.; Diez, A.; Kaluza, A.; Modlich, A.; Kamp, M.; Christen, J.; Ponce, F.A.; Kohn, E.; Krost, A., "MOVPE growth of GaN on Si(111) substrates," Journal of Crystal Growth, v 248, Feb. 1, 2003, p. 556-62.
Davis, R.F.; Nam, O.-H.; Bremser, M.D.; Zheleva, T., "Lateral epitaxial overgrowth of and defect reduction in GaN thin films,"

*Lasers and Electro-Optics Society Annual Meeting, 1998. LEOS '98. IEEE*, vol. 1, No. pp. 360-361 vol. 1, Dec. 1-4, 1998.

Dong-Ho Kim; Jaehoon Kim; Chi Cho; Heonsu Jeon, "GaN nano epitaxial lateral overgrowth on holographically patterned," *Compound Semiconductors, 2003. International Symposium on*,pp. 27-28, Aug. 25-27, 2003.

Feltin, E.; Beaumont, B.; Vennegues, P.; Vaille, M.; Gibart, P.; Riemann, T.; Christen, J.; Dobos, L.; Pecz, B., "Epitaxial lateral overgrowth of GaN on Si (111)," Journal of Applied Physics, v 93, n 1, Jan. 1, 2003, p. 182-5.

Fitzgerald et al., "Elimination of Dislocations in Heteroepitaxial MBE and RTCVD $Ge_xSi_{1-x}$ Grown on Patterned Si Substrates," *Journal of Electronic Materials*, vol. 19, No. 9 (1990), pp. 949-955.

Fitzgerald et al., "Epitaxial Necking in GaAs Growth on Pre-patterned Si Substrates," *Journal of Electronic Materials*, vol. 20, No. 10 (1991), pp. 839-853.

Fitzgerald et al., "Nucleation Mechanisms and the Elimination of Misfit Dislocations at Mismatched Interfaces by Reduction in Growth Areas," *J. Applied Phys.*, vol. 65, No. 6, (Mar. 15, 1989), pp. 2220-2237.

Fitzgerald, "The Effect of Substrate Growth Area on Misfit and Threading Dislocation Densities in Mismatched Heterostructures," *J. Vac. Sci. Technol.*, vol. 7, No. 4 (Jul./Aug. 1989), pp. 782-788.

Hersee, et al., "The Controlled Growth of GaN Nanowires," *Nano Letters*, vol. 6, No. 8 (2006), pp. 1808-1811.

Hiramatsu, K.; Nishiyama, K.; Onishi, M.; Mizutani, H.; Narukawa, M.; Motogaito, A.; Miyake, H.; Iyechika, Y.; Maeda, T., "Fabrication and characterization of low defect density GaN using facet-controlled epitaxial lateral overgrowth (FACELO)," Journal of Crystal Growth, v 221, Dec. 2000, p. 316-26.

Hollander et al., "Strain and Misfit Dislocation Density in Finite Lateral Size $Si_{1-x}Ge_x$ Films Grown by Selective Epitaxy," *Thin Solid Films*, vol. 292, (1997) pp. 213-217.

International Search Report for Patent Application No. PCT/US2006/019152, dated May 17, 2005.

Ipri, A.C.; Jastrzebski, L.L., "MONO/POLY technology for fabricating low-capacitance CMOS integrated circuits," *Electron Devices, IEEE Transactions on*, vol. 35, No. 8pp.1382-1383, Aug. 1988.

Jing Wang; Guo, L.W.; Jia, H.Q.; Wang, Y.; Xing, Z.G.; Li, W.; Chen, H.; Zhou, J.M., "Fabrication of patterned sapphire substrate by wet chemical etching for maskless lateral overgrowth of GaN," Journal of the Electrochemical Society, v 153, n 3, Mar. 2006, p. C182-5.

Ju, W.; Gulino, D.A.; Higgins, R. , "Epitaxial lateral overgrowth of gallium nitride on silicon substrate," Journal of Crystal Growth, v 263, n 1-4, Mar. 1, 2004, p. 30-4.

Kamiyama, S.; Iida, K.; Kawashima, T.; Kasugai, H.; Mishima, S.; Honshio, A.; Miyake, Y.; Iwaya, M.; Amano, H.; Akasaki, I., "UV laser diode with 350.9-nm-lasing wavelength grown by heteroepitaxial-lateral overgrowth technology," *Selected Topics in Quantum Electronics, IEEE Journal of*, vol. 11, No. 5pp. 1069-1073, Sep.-Oct. 2005.

Kamiyama, S.; Iwaya, M.; Takanami, S.; Terao, S.; Miyazaki, A.; Amano, H.; Akasaki, I., "UV light-emitting diode fabricated on hetero-ELO-grown $Al_{0.22}Ga0.78N$ with low dislocation density," Physica Status Solidi A, v 192, N. 2, Aug. 2002, p. 296-300.

Kidoguchi, I.; Ishibashi, A.; Sugahara, G.; Ban, Y., "Air-bridged lateral epitaxial overgrowth of GaN thin films," Applied Physics Letters, v 76, n 25, Jun. 19, 2000, p. 3768-70.

Knall et al., Threading Dislocations in GaAs Grown with Free Sidewalls on Si mesas, *J Vac. Sci. Technol. B*, vol. 12, No. 6, (Nov./Dec. 1994) pp. 3069-3074.

Krost et al., "GaN-based Optoelectronics on Silicon Substrates," *Materials Science & Engineering*, B93 (2002) pp. 77-84.

Kushida, K.; Takeuchi, H., "Epitaxial growth of $PbTiO_3$ films on $SrTiO_3$ by RF magnetron sputtering," *Ultrasonics, Ferroelectrics and Frequency Control, IEEE Transactions on*, vol. 38, No. 6pp. 656-662, Nov 1991.

Langdo et al., "High Quality Ge on Si by Epitaxial Necking," *Applied Physics Letters*, vol. 76, No. 25 (Jun. 19, 2000), pp. 3700-3702.

Lee et al., "Strain-relieved, Dislocation-free $In_xGa_{1-x}As/GaAs(001)$ Heterostructure by Nanoscale-patterned Growth," *Applied Physics Letters*, vol. 85, No. 18 (Nov. 1, 2004), pp. 4181-4183.

Lee, S.C.; Sun, X.Y.; Hersee, S.D.; Lee, J.; Ziang, Y.-B.; Xu, H.; Brueck, S.R.J., "Growth of GaN on a nanoscale periodic faceted Si substrate by metal organic vapor phase epitaxy," *Compound Semiconductors: Post-Conference Proceedings, 2003 International Symposium on*, vol., No. pp. 15-21, Aug. 25-27, 2003.

Li et al., "Heteropitaxy of High-quality Ge on Si by Nanoscale Ge seeds Grown through a Thin Layer of $SiO_2$," *Applied Physics Letters*, vol. 85, No. 11 (Sep. 13, 2004), pp. 1928-1930.

Li et al., "Morphological Evolution and Strain Relaxation of Ge Islands Grown on Chemically Oxidized Si(100) by Molecular-beam Epitaxy," *Journal of Applied Physics*, vol. 98, (2005), pp. 073504-1-073504-8.

Li et al., "Selective Growth of Ge on Si(100) through Vias of $SiO_2$ Nanotemplate Using Solid Source Molecular Beam Epitaxy," *Applied Physics Letters*, vol. 83, No. 24 (Dec. 15, 2003), pp. 5032-5034.

Liang et al., "Critical Thickness Enhancement of Epitaxial SiGe films Grown on Small Structures," *Journal of Applied Physics*, vol. 97, (2005) pp. 043519-1-043519-7.

Liu et al., "High Quality Single-crystal Ge on Insulator by Liquid-phase Epitaxy on Si Substrates," *Applied Physics Letters*, vol. 84, No. 14, (Apr. 4, 2004) pp. 2563-2565.

Liu et al., "Rapid Melt Growth of Germanium Crystals with Self-Aligned Microcrucibles on Si Substrates," *Journal of the Electrochemical Society*, vol. 152, No. 8, (2005) G688-G693.

Lourdudoss, S.; Soderstrom, D.; Angulo Barrios, C.; Sun, Y.T.; Rodriguez Messmer, E., "Semi-insulating epitaxial layers for optoelectronic devices," *Semiconducting and Insulating Materials Conference, 2000. SIMC-XI. International*, vol., No. pp. 171-178, 2000.

Luan et al., "High-quality Ge Epilayers on Si with LowThreading-dislocation Densities," *Applied Phsics Letters*, vol. 75, No. 19, (Nov. 8, 1999) pp. 2909-2911.

Luan, "Ge Photodectors for Si Microphotonics," Ph.D. Thesis, Massachusetts Institute of Technology, Department of Materials Science & Engineering (Jan. 12, 2001).

Lubnow et al., "Effect of III/V-Compound Epitaxy on Si Metal-Oxide-Semiconductor Circuits," *Jpn. J. Applied Phys.*, vol. 33 (1994) pp. 3628-3634.

Luryi et al., "New Approach to the High Quality Epitaxial Growth of Latticed-mismatched Materials," *Appl. Phys. Lett.*, vol. 49, No. 3, (Jul. 21, 1986) 140-142.

Martinez et al., "Characterization of GaAs Conformal Layers Grown by Hydride Vapour Phase Epitaxy on Si Substrates by Microphotoluminescence Cathodoluminescence and microRaman," *Journal of Crystal Growth*, vol. 210 (2000) pp. 198-202.

Matsunaga et al., "A New Way to Achieve Dislocation-free Heteroepitaxial Growth by Molecular Beam Epitaxy: Vertical Microchannel Epitaxy," *Journal of Crystal Growth*, vol. 237-239 (2002) pp. 1460-1465.

Monroy, E.; Calle, F.; Munoz, E.; Beaumont, B.; Omnes, F.; Gibart, P., "High UV/visible contrast photodiodes based on epitaxial lateral overgrown GaN layers," *Electronics Letters*, vol. 35, No. 17pp. 1488-1489, Aug. 19, 1999.

Nakano, K.; Imura, M.; Narita, G.; Kitano, T.; Hirose, Y.; Fujimoto, N.; Okada, N.; Kawashima, T.; Iida, K.; Balakrishnan, K.; Tsuda, M.; Iwaya, M.; Iwaya, M.; Kamiyama, S.; Amano, H.; Akasaki, I., "Epitaxial lateral overgrowth of AIN layers on patterned sapphire substrates," Source: Physica Status Solidi A, v 203, n 7, May 2006, p. 1632-5.

Nam et al., "Lateral Epitaxy of Low Defect Density GaN Layers via Organometallic Vapor Phase Epitaxy," *Appl. Phys. Letters*, vol. 71, No. 18, (Nov. 3, 1997) pp. 2638-2640.

Naoi et al, "Epitaxial Lateral Overgrowth of GaN on Selected-area Si (111) Substrate with Nitrided Si Mask," *Journal of Crystal Growth*, vol. 248, (2003) pp. 573-577.

Neudeck, G.W.; Tai-Chi Su; Denton, J.P., "Novel silicon epitaxy for advanced MOSFET devices," *Electron Devices Meeting, 2000. IEDM Technical Digest. International*, vol., No. pp. 169-172, 2000.

Norman, A.G.; Hanna, M.C.; Romero, M.J.; Jones, K.M.; Al-Jassim, M.M., "Characterization of MOCVD lateral epitaxial overgrown III-V semiconductor layers on GaAs substrates," *Compound Semiconductors, 2003. International Symposium on*, vol., No. pp. 45-46, Aug. 25-27, 2003.

Parillaud et al, "High Quality InP on Si by Conformal Growth," *Appl. Phys. Lett.*, vol. 68, No. 19 (May 6, 1996) pp. 2654-2656.

Piffault, N.; Parillaud, O.; Gil-Hafon, E.; Leymarie, J.; Vasson, A.; Vasson, A.M.; Cadoret, R.; Gerard, B.; Pribat, D., "Assessment of the strain of InP films on Si obtained by HVPE conformal growth," *Indium Phosphide and Related Materials, 1994. Conference Proceedings., Sixth International Conference on*, vol., No. pp. 155-158, Mar. 27-31, 1994.

Pribat et al., "High Quality GaAs on Si by Conformal Growth," *Appl. Phys. Lett.*, vol. 60, No. 17 (Apr. 27, 1992) pp. 2144-2146.

Ren, D.; Wei Zhou; Dapkus, P.D., "Low-dislocation-density, nonplanar GaN templates for buried heterostructure lasers grown by lateral epitaxial overgrowth," Applied Physics Letters, v 86, n 11, Mar. 14, 2005, 111901-1-3.

Sangwoo Pae; Taichi Su; Denton, J.P.; Neudeck, G.W., "Multiple layers of silicon-on-insulator islands fabrication by selective epitaxial growth," *Electron Device Letters, IEEE*, vol. 20, No. 5pp. 194-196, May 1999.

Schaub, J.D.; Li, R.; Schow, C.L.; Campbell, J.C.; Neudeck, G.W.; Denton, J., "Resonant-cavity-enhanced high-speed Si photodiode grown by epitaxial lateral overgrowth," *Photonics Technology Letters, IEEE*, vol. 11, No. 12pp.1647-1649, Dec. 1999.

Shahidi, G.; Davari, B.; Taur, Y.; Warnock, J.; Wordeman, M.R.; McFarland, P.; Mader, S.; Rodriguez, M.; Assenza, R.; Bronner, G.; Ginsberg, B.; Lii, T.; Polcari, M.; Ning, T.H., "Fabrication of CMOS on ultrathin SOI obtained by epitaxial lateral overgrowth and chemical-mechanical polishing," *Electron Devices Meeting, 1990. Technical Digest., International*, vol., No.pp. 587-590, Dec. 9-12, 1990.

Siekkinen, J.W.; Klaasen, W.A.; Neudeck, G.W., "Selective epitaxial growth silicon bipolar transistors for material characterization," *Electron Devices, IEEE Transactions on*, vol. 35, No. 10pp.1640-1644, Oct. 1988.

Su et al., "Catalytic Growth of Group III-nitride Nanowires and Nanostructures by Metalorganic Chemical Vapor Deposition," *Applied Physics Letters*, vol. 86 (2005) pp. 013105-1-013105-3.

Sun, Y.; Messmer, E.R.; Soderstrom, D.; Jahan, D.; Lourdudoss, S., "Temporally resolved growth of InP in the openings off-oriented from [110] direction," *Indium Phosphide and Related Materials, 2000. Conference Proceedings. 2000 International Conference on*, vol., No.pp. 227-230, 2000.

Sun, Y.T.; Baskar, K.; Berggren, J.; Lourdudoss, S., "InGaAsP multi-quantum wells at 1.5 /spl mu/m wavelength grown on indium phosphide templates on silicon," *Indium Phosphide and Related Materials, 2003. International Conference on*, vol., No.pp. 277-280, May 12-16, 2003.

Sun, Y.T.; Lourdudoss, S., "Sulfur doped indium phosphide on silicon substrate grown by epitaxial lateral overgrowth," *Indium Phosphide and Related Materials, 2004. 16th IPRM. 2004 International Conference on*, pp. 334-337, May 31-Jun. 4, 2004.

Sun, Y.T.; Napierala, J.; Lourdudoss, S., "Selective area growth of InP on InP precoated silicon substrate by hydride vapor phase epitaxy," *Indium Phosphide and Related Materials Conference, 2002. IPRM. 14th*, vol., No.pp. 339-342, 2002.

Suryanarayanan, G.; Khandekar, A.A.; Kuech, T.F.; Babcock, S.E., "Microstructure of lateral epitaxial overgrown InAs on (100) GaAs substrates," Applied Physics Letters, v 83, n 10, Sep. 8, 2003, p. 1977-9.

Taichi Su; Denton, J.P.; Neudeck, G.W., "New planar self-aligned double-gate fully-depleted P-MOSFETs using epitaxial lateral overgrowth (ELO) and selectively grown source/drain (S/D)," *SOI Conference, 2000 IEEE International*, vol., No.pp. 110-111, 2000.

Tamura et al., "Threading Dislocations in GaAs on Pre-patterned Si and in Post-patterned GaAs on Si," *Journal of Crystal Growth*, vol. 147, (1995) pp. 264-273.

Tanaka et al., "Structural Characterization of GaN Lateral Overgrown on a (111) Si Substrate," *Applied Physics Letters*, vol. 79, No. 7 (Aug. 13, 2001) pp. 955-957.

Tomiya, S.; Hino, T.; Goto, S.; Takeya, M.; Ikeda, M., "Dislocation related issues in the degradation of GaN-based laser diodes," *Selected Topics in Quantum Electronics, IEEE Journal of*, vol. 10, No. 6pp. 1277-1286, Nov.-Dec. 2004.

Tran et al., "Growth and Characterization of InP on Silicon by MOCVD," *Journal of Crystal Growth*, vol. 121, (1992) pp. 365-372.

Tsang, W.; Olsson, N.; Logan, R.; Henry, C.; Johnson, L.; Bowers, J.; Long, J., "The heteroepitaxial ridge-overgrown distributed feedback laser," *Quantum Electronics, IEEE Journal of*, vol. 21, No. 6pp. 519-526, Jun. 1985.

Tsaur, B.-Y.; McClelland, R.W.; Fan, J.C.C.; Gale, R.P.; Salerno, J.P.; Vojak, B.A.; Bozler, "Low-dislocation-density GaAs epilayers grown on Ge-coated Si substrates by means of lateral epitaxial overgrowth," Applied Physics Letters, v 41, n 4, Aug. 15, 1982, 347-9.

Tsuji et al., "Selective Epitaxial Growth of GaAs on Si with Strained Sort-period Superlattices by Molecular Beam Epitaxy under Atomic Hydrogen Irradiation," *J. Vac. Sci. Technol. B.*, vol. 22, No. 3, (May/Jun. 2004) pp. 1428-1431.

Vanamu et al., "Epitaxial Growth of High-quality Ge Films on Nanostructured Silicon Substrates," *Applied Physics Letters*, vol. 88, (2006) pp. 204104-1-204104-3.

Vanamu et al., "Growth of High Quality Ge/Si$_{1-x}$Ge$_x$ on Nano-scale Patterned Si Structures," *J. Vac. Sci. Techn. B*, vol. 23, No. 4, (Jul./Aug. 2005) pp.1622-1629.

Vanamu et al., "Heteroepitaxial Growth on Microscale Patterned Silicon Structures," *Journal of Crystal Growth*, vol. 280, (2005) pp. 66-74.

Vanamu et al., "Improving Ge/Si$_x$Ge$_{1-x}$ Film Quality through Growth onto Patterned Silicon Substrates," *Advances in Electronics Manufacturing Technology*, (Nov. 8, 2004) pp. 1-4.

Wernersson et al., "InAs Epitaxial Lateral growth of W Marks," *Journal of Crystal Growth*, vol. 280 (2005) pp. 81-86.

Wuu, D.S.; Wang, W.K.; Wen, K.S.; Huang, S.C.; Lin, S.H.; Huang, S.Y.; Lin, C.F.; Horng, R.H., "Defect reduction and efficiency improvement of near-ultraviolet emitters via laterally overgrown GaN on a GaN/patterned sapphire template," Applied Physics Letters, v 89, n 16, Oct. 16, 2006, p. 161105-1-3.

Xie et al., "From Porous Si to Patterned Si Substrate: Can Misfit Strain Energy in a Continuous Heteroepitaxial Film Be Reduced?" *J Va. Sci. Technol. B*, vol. 8, No. 2, (Mar./Apr. 1990) pp. 227-231.

Yamaguchi et al., "Analysis for Dislocation Density Reduction in Selective Area Growth GaAs Films on Si Substrates," *Appl. Phys. Lett.* vol. 56, No. 1, (Jan. 1, 1990) pp. 27-29.

Yamamoto et al., "Optimization of InP/Si Heteroepitaxial Growth Conditions Using Organometallic Vapor Phase Epitaxy," *Journal of Crystal Growth*, vol. 96, (1989) pp. 369-377.

Yang et al., "Selective Area Deposited Blue GaN-InGaN Multiple-quantum Well Light Emitting Diodes over Silicon Substrates," Applied Physics Letter, vol. 76, No. 3, (Jan. 17, 2000) pp. 273-275.

Yingda Dong; Okuno, Y.L.; Mishra, U.K., "Selective area growth of InP through narrow openings by MOCVD and its application to InP HBT," *Indium Phosphide and Related Materials, 2003. International Conference on*, vol., No.pp. 389-392, May 12-16, 2003.

Yoon et al., "Selective Growth of Ge Islands on Nanometer-scale Patterned SiO$_2$/Si Substrate by Molecular Beam Epitaxy," *Applied Physics Letters*, vol. 89 (2006) pp. 063107-1 063107-3.

Zamir et al., "Thermal Microcrack Distribution Control in GaN Layers on Si Substrates by Lateral Confined Epitaxy," *Applied Physics Letters*, vol. 78, No. 3, (Jan. 15, 2001) pp. 288-290.

Zang, K.Y.; Wang, Y.D.; Chua, S.J.; Wang, L.S., "Nanoscale lateral epitaxial overgrowth of GaN on Si (111)," Applied Physics Letters, v 87, n 19, Nov. 7, 2005, p. 193106-1-3.

Zang, K.Y.; Wang, Y.D.; Chua, S.J.; Wang, L.S.; Tripathy, S.; Thompson, C.V., "Nanoheteroepitaxial lateral overgrowth of GaN on nanoporous Si(111)," Applied Physics Letters, v 88, n 14, Apr. 3, 2006, p. 141925.

Zela et al., "Single-crystalline Ge Grown Epitaxially on Oxidized and Reduced Ge/Si (100) Islands," *Journal of Crystal Growth*, vol. 263 (2004) pp. 90-93.

Zhang et al., "Removal of Threading Dislocations from Patterned Heteroepitaxial Semiconductors by Glide to Sidewalls," Journal of Electronic Materials, vol. 27, No. 11, (1998) pp. 1248-1253.

Zhang et al., Strain Status of Self-assembled InAs Quantum Dots, *Applied Physics Letters*, vol. 77, No. 9, (Aug. 28, 2000) pp. 1295-1297.

Zheleva, T.S.; Ok-Hyun Nam; Ashmawi, W.M.; Griffin, J.D.; Davis, R.F., "Lateral epitaxy and dislocation density reduction in selectively grown GaN structures," Journal of Crystal Growth, v 222, n 4, Feb. 2001, p. 706-18.

Zubia et al., "Initial Nanoheteroepitaxial Growth of GaAs on Si (100) by OMVPE." Journal of Electronic Materials, vol. 30, No. 7, (2001) pp. 812-816.

Bean et al., "$Ge_xSi_{1-x}$/Si strained-later superlattice grown by molecular beam epitaxy," J. Vac. Sci. Tech. A (2)2, pp. 436-440 (1984).

Blakeslee, "The Use of Superlattices to Block the Propogation of Dislocations in Semiconductors," Mat. Res. Soc. Symp. Proc. 148, pp. 217-227, (1989).

Currie et al., "Carrier Mobilities and Process Stability of Strained Si n- and p-MOSFETs on SiGe Virtual Substrates," J. Vac. Sci. Tech. B 19(6), pp. 2268-79 (2001).

Donaton et al., "Design and Fabrication of MOSFETs with a Reverse Embedded SiGe (Rev. eSiGe) Structure," 2006 IEDM, pp. 465-468.

International Technology Roadmap for Semiconductors- Front End Processes, pp. 1-62 (2005).

IPRP for International Application No. PCT/US2006/033859, mailed Mar. 20, 2008.

Matthews et al., "Defects in Epitaxial Multilayers- Misfit Dislocations," J. Crystal Growth 27, pp. 118-125(1974).

Pidin et al., "MOSFET Current Drive Optimization Using Silicon Nitride Capping Layer for 65-nm Technology Node," 2004 Symp. On VLSI Technology, Dig. Tech. Papers, pp. 54-55.

Rim et al., "Enhanced Hole Mobilities in Surface-channel Strained-Si p-MOSFETs," 1995 IEDM, pp. 517-520.

Thean et al., "Uniaxial-Biaxial Hybridization for Super-Critical Strained-Si Directly on Insulator (SC-SSOI) PMOS with Different Channel Orientations," IEEE, pp. 1-4 (2005).

Thompson et al., "A Logic Nanotechnology Featuring Strained-Silicon," 25 IEEE Electron Device Letters 4, pp. 191-193 (2004).

Yin et al., "Ultrathin Strained-SOI by Stress Balance on Compliant Substrates and FET Performance," 52 IEEE Trans. on Electron Devices 10, pp. 2207-2214 (2005).

Examination Report in European Patent Application No. 06800414.2, mailed Mar. 5, 2009 (3 pages).

International Preliminary Report on Patentability for International Application No. PCT/US2007/019568, mailed Mar. 19, 2009 (7 pages).

International Preliminary Report on Patentability for International Application no. PCT/US07/021023, mailed Apr. 9, 2009 (8 pages).

International Preliminary Report on Patentability for International Application No. PCT/US07/022392, mailed Apr. 30, 2009 (14 pages).

International Preliminary Report on Patentability for International Application No. PCT/US07/020777, mailed Apr. 9, 2009 (12 pages).

International Search Report and Written Opinion for International Application No. PCT/US2008/068377, mailed Jul. 6, 2009 (19 pages).

Campo et al., "Comparison of Etching Processes of Silicon and Germanium in SF6-02 RadioFrequency Plasma," 13 J. Vac. Sci. Tech. B 2, pp. 235-241 (1995).

Oehrlein et al., "Studies of the Reactive Ion Etching of SiGe Alloys," 9 J. Vac. Sci. Tech. A 3, pp. 768-774 (1991).

Bogumilowicz et al., "Chemical Vapour Etching of Si, SiGe and Ge with HCl; Applications to the Formation of Thin Relaxed SiGe Buffers and to the Revelation of Threading Dislocations," 20 Semicond. Sci. Tech., pp. 127-134 (2005).

Williams et al., "Etch Rates for Micromachining Processing—Part II," 12 J. Microelectromechanical Sys. 6, pp. 761-778 (2003).

Williams et al., "Etch Rates for Micromachining Processes," 5 J. Microelectromechanical Sys. 4, pp. 256-269 (1996).

\* cited by examiner

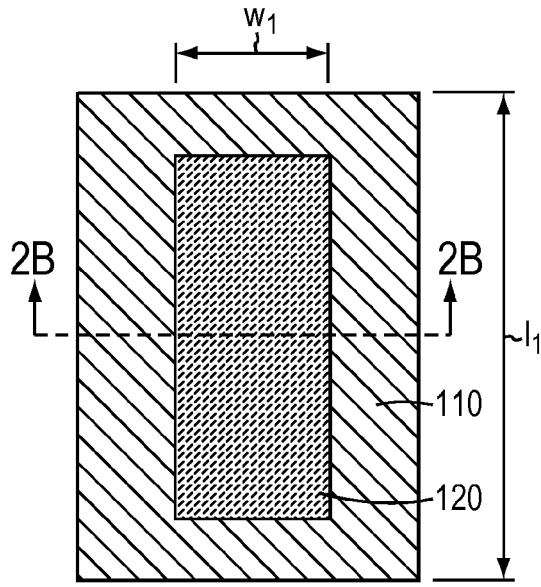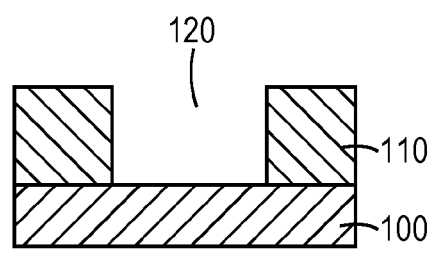
FIG. 2A
FIG. 2B
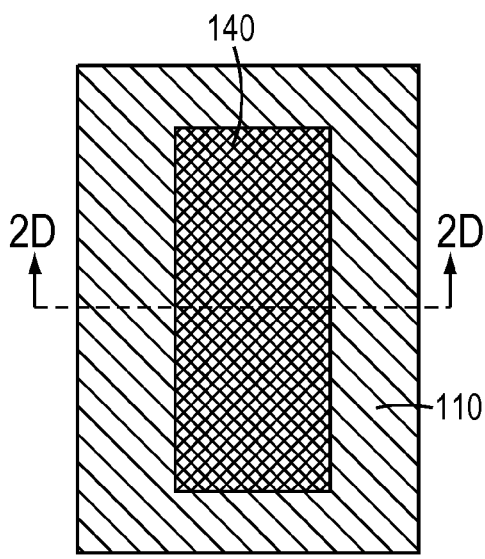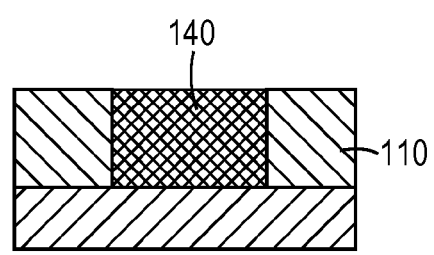
FIG. 2C
FIG. 2D

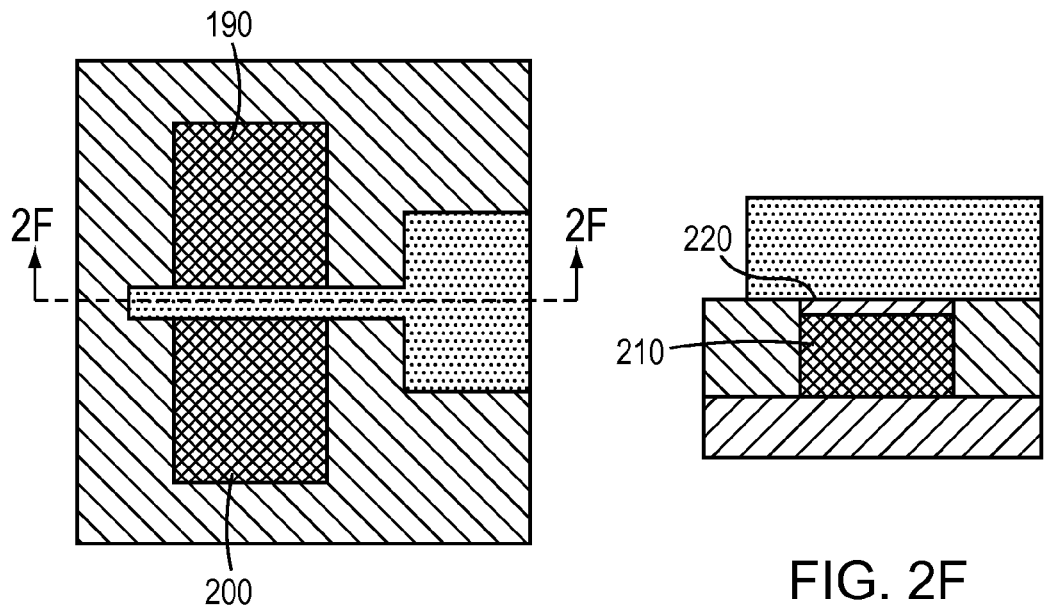
FIG. 2E
FIG. 2F
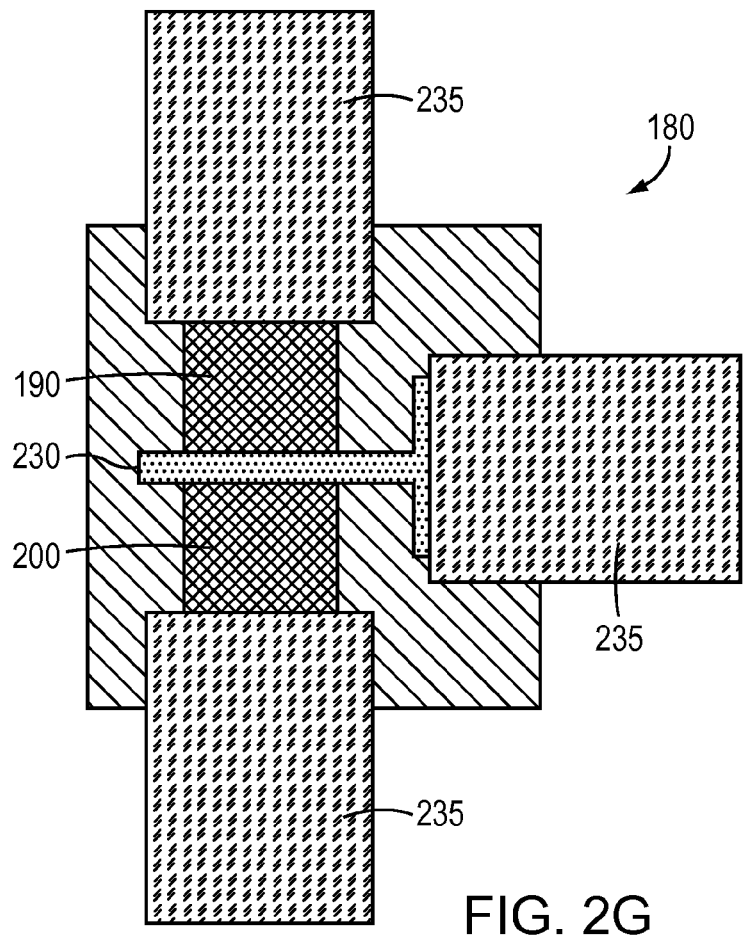
FIG. 2G

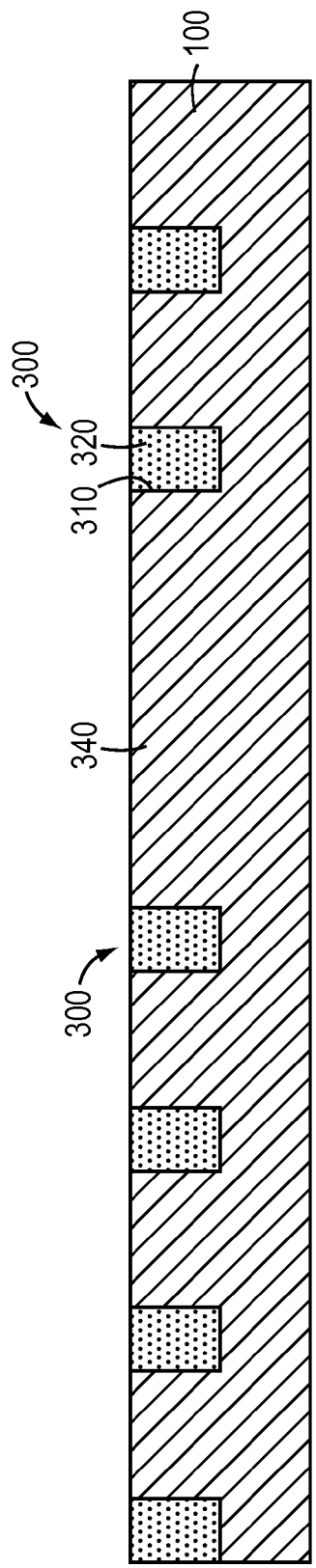
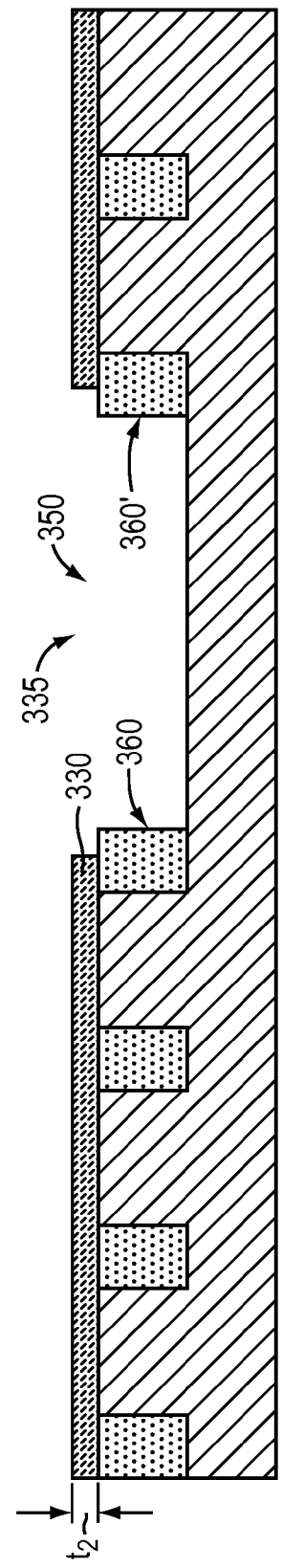
FIG. 3A
FIG. 3B

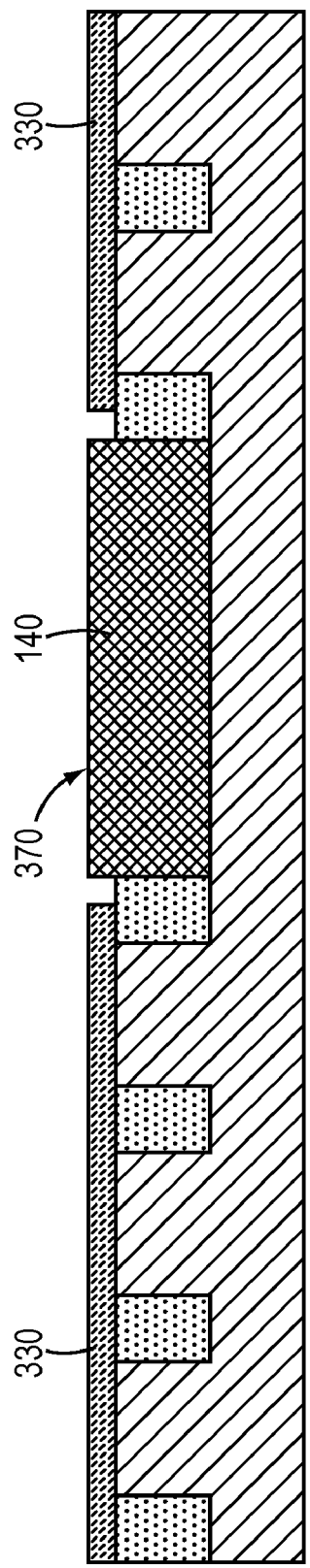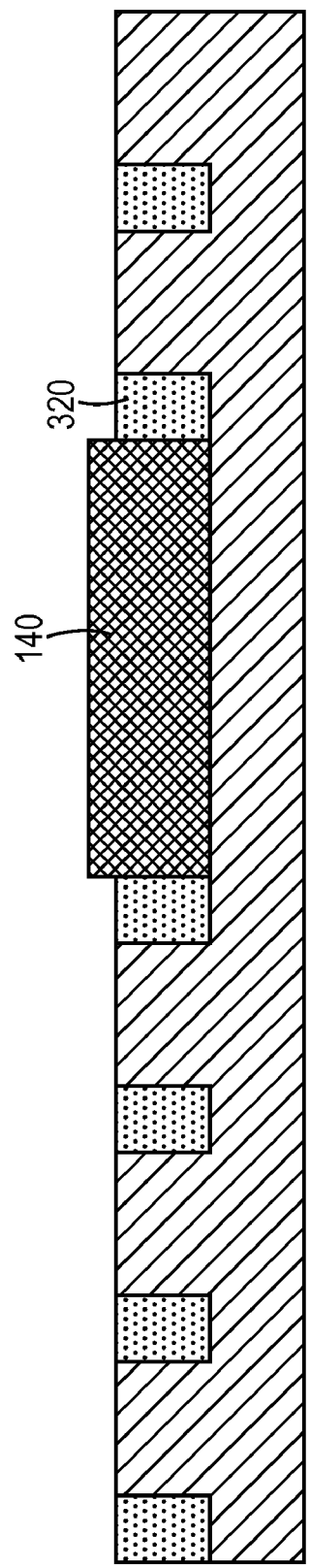

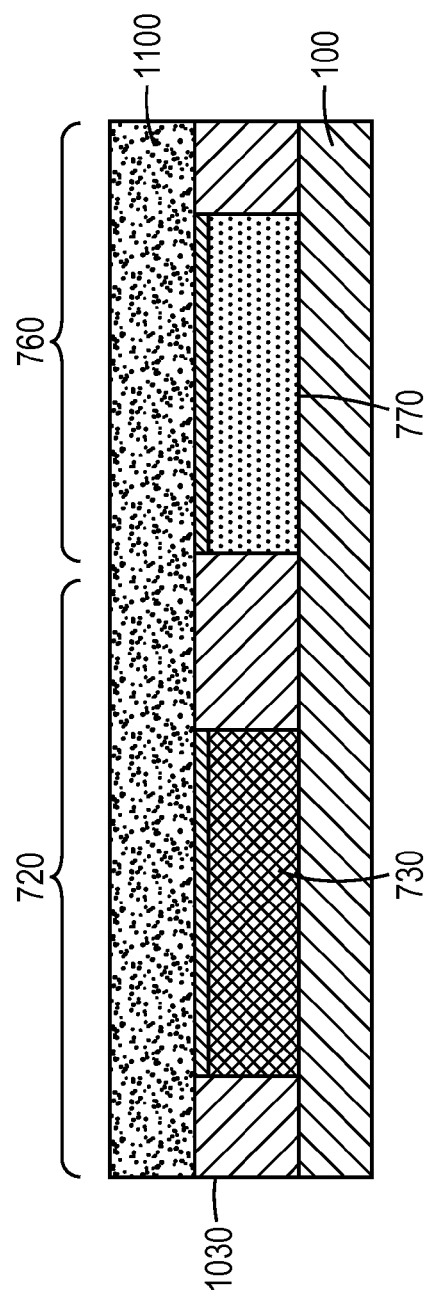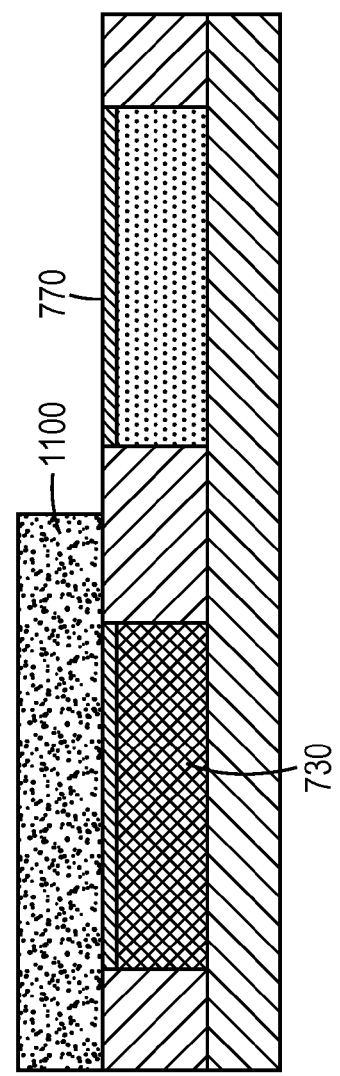
FIG. 11A
FIG. 11B

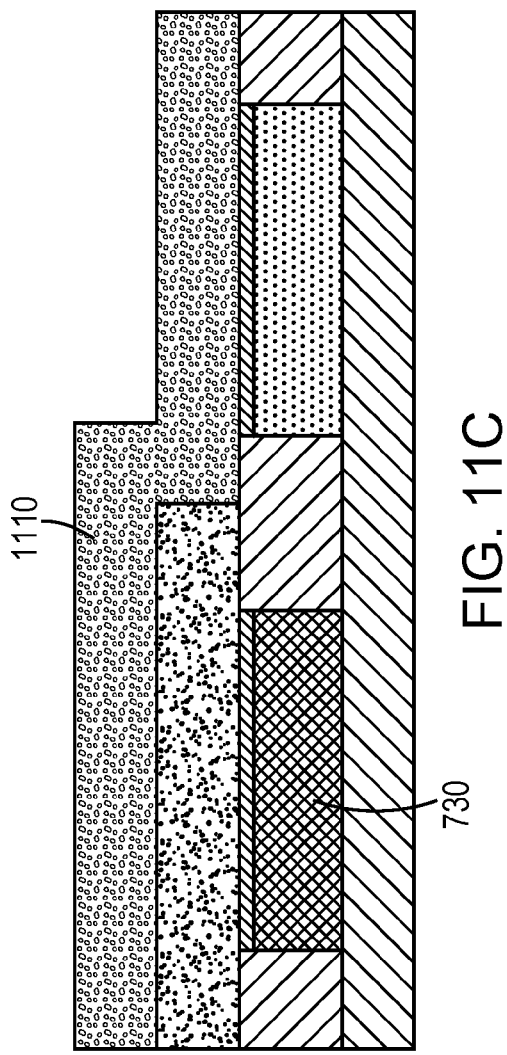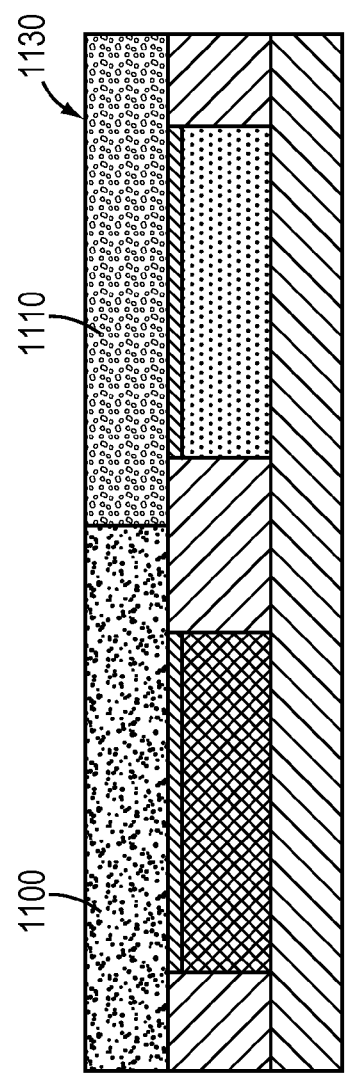

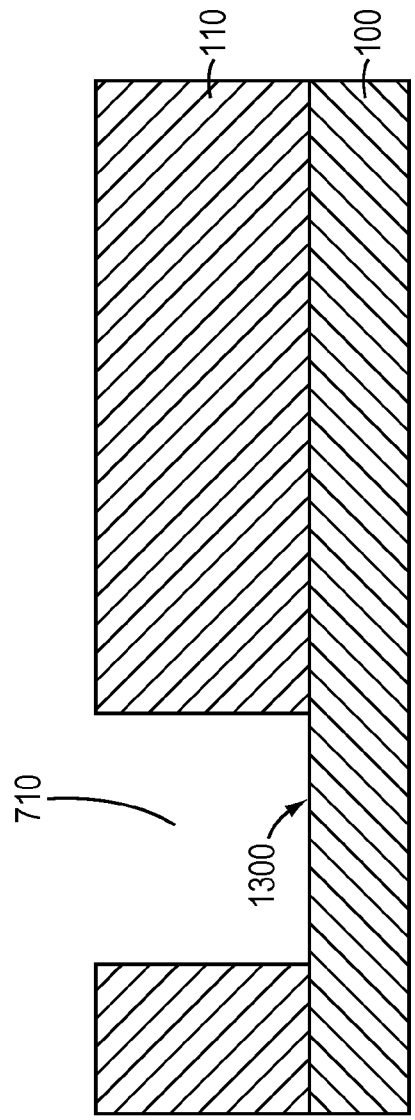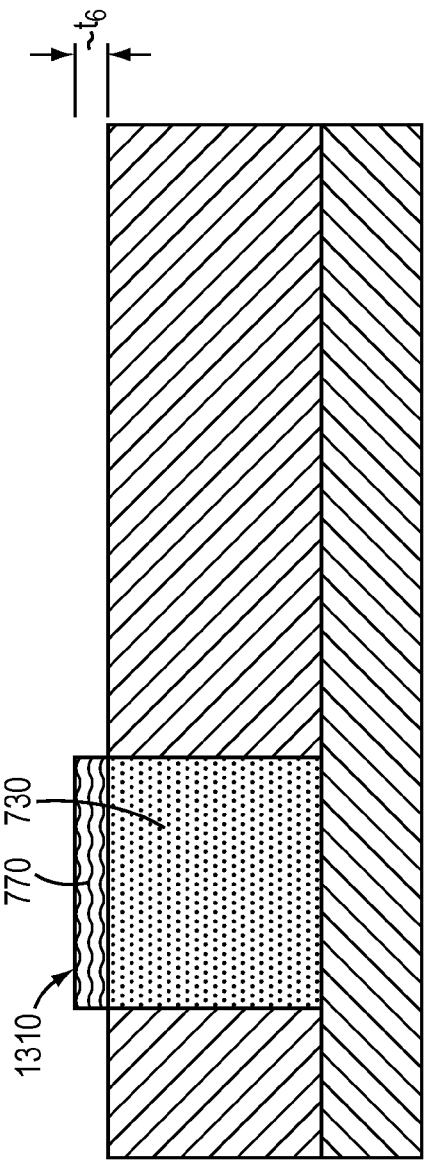
FIG. 13A
FIG. 13B

SOLUTIONS FOR INTEGRATED CIRCUIT INTEGRATION OF ALTERNATIVE ACTIVE AREA MATERIALS

RELATED APPLICATIONS

This application claims the benefit of U.S. Provisional Application 60/702,363 filed Jul. 26, 2005, the entire disclosure of which is hereby incorporated by reference.

FIELD OF THE INVENTION

This invention relates to methods and materials for formation of structures including alternative active area materials.

BACKGROUND

As geometric scaling of Si-based MOSFET technology becomes more challenging, the heterointegration of alternate materials with Si becomes an attractive option for increasing the innate carrier mobility of MOSFET channels. Heterointegration of alternate materials has thus far been limited to the addition of SiGe alloys of small Ge content for use as source-drain contact materials or heterojunction bipolar transistor base layers. Since such layers are only slightly lattice mismatched to Si, and since most modern Si MOSFET processes are compatible with these dilute SiGe alloys, few disruptions in the Si MOSFET integration sequence have been necessary. Unfortunately, the drive for increased carrier mobility (and concomitant device drive current) will soon necessitate the use of other, more highly lattice-mismatched materials for historically Si-based devices, requiring more disruptive changes to the traditional device integration flow.

SUMMARY

Heterointegration of alternative materials onto conventional and new substrates is desirable for various electronic and optoelectronic applications. For example, the possibility of the heterointegration of III-V, II-VI materials and/or Ge with Si is an attractive path for increasing the functionality and performance of the CMOS platform. An economical solution to heterointegration could enable new fields of applications, such as replacing Si in CMOS transistors, particularly for critical path logic devices. This could significantly lower (a) channel resistance, due to the ultra-high mobility and saturation velocity afforded by various non-Si semiconductors, and (b) source/drain resistance, due both to high mobility and to the narrower bandgap of many non-Si semiconductors, with the narrower bandgap leading to a lower electrical resistance between the metal (or metal-alloy) contact and the semiconductor. Another new application could be the combination of Si CMOS logic with ultra-high speed RF devices, such as InP- or GaAs-based high electron mobility transistor (HEMT) or heterojunction bipolar transistor (HBT) devices similar to those utilized for high-frequency applications today. Yet another application could be the combination of Si CMOS logic with opto-electronic devices, since many non-Si semiconductors have light emission and detection performance superior to Si.

Selective epitaxy is an attractive path for hetero-materials integration for several reasons. First, it allows adding the non-Si semiconductor material only where it is needed, and so is only marginally disruptive to a Si CMOS process performed on the same wafer. Also, selective epitaxy may allow the combination of multiple new materials on a Si wafer, e.g., Ge for PMOS and InGaAs for NMOS. Furthermore, it is likely to be much more economical than key alternative paths, e.g., layer transfer of global hetero-epitaxial films, especially for integrating materials with large lattice mismatch.

Methods of forming areas of alternative material on crystalline semiconductor substrates are described. "Alternative" as used herein refers to either a non-Si semiconductor, or Si with a different surface or rotational orientation compared to an underlying Si substrate. Such areas are suitable for use as active area in MOSFETs or other electronic or opto-electronic devices. Also, designs for aspects of MOSFET devices utilizing such non-Si active areas are provided.

In an aspect, the invention features a method for forming a structure, including providing a substrate including a crystalline semiconductor material. A masking layer is formed over the substrate, and a window is defined in the masking layer. The window is filled with an active area material by selective epitaxy. A device is defined including at least a portion of the active area material.

The following feature may be included. A surface of the active area material is planarized such that the surface is substantially coplanar with a surface of the masking layer.

In another aspect, the invention features a method for forming a structure, including providing a substrate comprising a crystalline semiconductor material, and defining a first shallow trench isolation region in the semiconductor material. A thin dielectric layer is defined over the substrate, and a window is defined in the thin dielectric layer to expose a portion of the semiconductor material bound by the first shallow trench isolation region. The exposed portion of the semiconductor material is removed to define an opening. The opening is filled with an active area material by selective epitaxy. The thin dielectric layer is selectively removed, and a device is defined including at least a portion of the active area material.

One or more of the following features may be included. A surface of the active area material is planarized such that the surface is substantially coplanar with a surface of the thin dielectric layer. The substrate includes a layer including the crystalline semiconductor material bonded to a wafer. The crystalline semiconductor material has a first crystalline orientation and the active area material includes a second crystalline semiconductor material having a second crystalline orientation different from the first crystalline orientation.

A second shallow trench isolation region is defined in the semiconductor material. A ratio of a width of the first shallow trench isolation region to a width of the second shallow trench isolation region is greater than 1, e.g., selected from a range of 1.2 to 3.

In another aspect, the invention features a method for forming a structure, the method including providing a substrate comprising a crystalline semiconductor material and defining a first shallow trench isolation region in the semiconductor material. A thin dielectric layer is defined over the substrate. A window is defined in the thin dielectric layer to expose a portion of the first shallow trench isolation region. The exposed portion of the first shallow trench isolation region is removed to define an opening. The opening is filled with an active area material by selective epitaxy. The thin dielectric layer is selectively removed, and a device is defined including at least a portion of the active area material.

One or more of the following features may be included. A surface of the active area material may be planarized such that the surface is substantially coplanar with a surface of the thin dielectric layer. A second shallow trench isolation region is defined in the semiconductor material, such that a ratio of a width of a remaining portion of the first shallow trench isolation region to a width of the second shallow trench isolation region is greater than 1, e.g., selected from a range of 1.2 to 3.

In another aspect, the invention features a structure that has a first active area including a first active area material and bound by a first shallow trench isolation region having a first width. A second active area includes a second active area material and is bound by a second shallow trench isolation region having a second width. A ratio of the first width to the second width is greater than 1.

One or more of the following features may be included. The first active area material is a semiconductor such as Ge, SiGe, SiC, diamond, a III-V semiconductor, and/or a II-VI semiconductor, and the second active area material includes Si. The first active area material has a first crystalline orientation and the second active area material has a second crystalline orientation different from the first crystalline orientation. The ratio of the first width to the second width is selected from a range of 1.2 to 3.

In another aspect, the invention features a method for forming a structure, the method including providing a substrate comprising a crystalline material and forming a first masking layer over the substrate. A first opening is defined in the first masking layer to expose a first portion of the substrate in a first region of the substrate. The first opening is filled with a first active area material by selective epitaxy. A second opening is defined in the first masking layer to expose a second portion of the substrate in a second region of the substrate. The second opening is filled with a second active area material by selective epitaxy. A first device is defined that includes at least a portion of the first active area material, and a second device is defined that includes at least a portion of the second active area material.

One or more of the following features may be included. A second masking layer is formed over the first region of the substrate before filling the second opening with the second active area material, and the second masking layer is removed after the second opening is filled with the second active area material. A surface of the first active area material and a surface of the second active area material is planarized after the removal of the second masking layer.

In another aspect, the invention features a structure including a first isolation region and a first active area including a first semiconductor material and bound by the first isolation region. The structure also includes a second isolation region and a second active area including a second semiconductor material different from the first semiconductor material and bound by the second isolation region. A surface of the first semiconductor material, a surface of the second semiconductor material, a surface of the first isolation region, and a surface of the second isolation region are all substantially coplanar.

One or more of the following features may be included. The first semiconductor material has a first crystalline orientation and the second semiconductor material has a second crystalline orientation different from the first crystalline orientation. The first semiconductor material includes Ge, InAs, InGaAs, InSb, AlSb, InAlSb, GaAs, or InP, and the second semiconductor material includes Si and/or Ge.

In another aspect, the invention features a structure including an n-FET having a first channel comprising a first active area material, a first source, and a first drain region. A p-FET has a second channel including a second active area material, a second source and a second drain region. The first source and drain regions and second source and drain regions include the same source/drain material.

One or more of the following features may be included. The first channel material is under tensile strain. The second channel material is under compressive strain. At least a portion of the source/drain material in the first source and first drain regions is disposed in a first and a second recess, at least a portion of the source/drain material in the second source and second drain regions is disposed in a third and a fourth recess, and a lattice constant of the source/drain material is smaller than a lattice constant of the first active area material and larger than a lattice constant of the second active area material.

At least a portion of the source/drain material in the first source and first drain regions is disposed in a first and a second recess, at least a portion of the source/drain material in the second source and second drain regions is disposed in a third and a fourth recess, and a lattice constant of the source/drain material is larger than a lattice constant of the first active area material and smaller than a lattice constant of the second active area material.

At least a portion of the source/drain material in the first source and first drain regions is disposed in a first and a second recess, the source/drain material in the second source and second drain regions is disposed on a top surface of the second active area material, and a lattice constant of the source/drain material is smaller than a lattice constant of the first active area material and smaller than a lattice constant of the second active area material. The source/drain material includes a group IV semiconductor.

The source/drain material in the first source and first drain regions is disposed on a top surface of the first active area material, at least a portion of the source/drain material in the second source and second drain regions is disposed in a third and a fourth recess, and a lattice constant of the source/drain material is larger than a lattice constant of the first active area material and larger than a lattice constant of the second active area material.

In another aspect, the invention features a method for forming a device, the method including providing a first active area material in a first region of a substrate and providing a second active area material in a second region of the substrate. A first source and a first drain are defined by the definition of a first and a second recess by removing a first portion and a second portion of the first active area material, and the deposition of a source/drain material into the first and second recesses. A second source and a second drain are defined by the definition of a third and a fourth recess by removing a first portion and second portion of the second active area material, and the deposition of the source/drain material into the third and fourth recesses. A first device is defined having a channel disposed in the first active area material between the first source and first drain. A second device is defined having a channel disposed in the second active area material between the second source and second drain.

One or more of the following features may be included. The definition of the first, second, third, and fourth recesses includes a non-selective etch that removes the first and second active area materials at approximately the same rate. The definition of the first and second recesses in the first active material includes an etch that is highly selective with respect to the second active material. Defining the third and fourth recesses in the second active material includes an etch that is highly selective with respect to the first active material.

In another aspect, the invention features a method for forming a structure, the method including providing a substrate, providing a first active area material over a first portion of the substrate, and providing a second active area material over a second portion of the substrate. A thin layer is deposited over the first and second active area materials. A gate dielectric layer is formed over the thin layer. A first device, such as an n-FET, including the first active area material and a second device, such as a p-FET, including the second active area material are formed.

In another aspect, the invention features a structure including a first active area including a first active area material and a second active area including a second active area material different from the first active area material. A thin layer is disposed over the first active area material and the second active area material, and a gate dielectric layer is disposed over the thin layer.

One or more of the following features may be included. The first active area material and second active area material each include at least one of Ge, SiGe, SiC, diamond, III-V semiconductors, and II-VI semiconductors, and the thin layer includes Si. The gate dielectric layer includes at least one of $SiO_2$, SiON, $Si_3N_4$, and high-k dielectrics.

In another aspect, the invention features a method for forming a structure, the method including providing a substrate, providing a first active area material over a first portion of the substrate, and providing a second active area material over a second portion of the substrate. A first gate dielectric layer is formed over the first active area material, and a second gate dielectric layer is formed over the second active area material. A first electrode layer is deposited over the first and second active area materials. A portion of the first electrode layer disposed over the second active area material is removed. A second electrode layer is deposited over the first and second active areas. The layers disposed over the substrate are planarized to define a co-planar surface including a surface of the first electrode layer disposed over the first active area material and a surface of the second electrode layer disposed over the second active area material. A first device including the first active area material and a second device including the second active area material are formed.

One or more of the following features may be included. The first device includes an n-FET. The first electrode layer includes at least one of indium, tantalum, zirconium, tungsten, molybdenum, chromium, tin, zinc, cobalt, nickel, rhenium, ruthenium, platinum, titanium, hafnium, silicon, and nitrogen. The second device includes a p-FET. The second electrode layer includes at least one of copper, molybdenum, chromium, tungsten, ruthenium, tantalum, zirconium, platinum, hafnium, titanium, cobalt, nickel, silicon, and nitrogen.

In another aspect, the invention features a structure including a first active area including a first active area material, and a second active area including a second active area material different from the first active area material. A first gate electrode material is disposed over the first active area material, and a second gate electrode material different from the first gate electrode material is disposed over the second active area material. The first gate electrode material includes at least one of indium, tantalum, zirconium, tungsten, molybdenum, chromium, tin, zinc, cobalt, nickel, rhenium, ruthenium, platinum, titanium, hafnium, silicon, and nitrogen, and the second gate electrode material includes at least one of copper, molybdenum, chromium, tungsten, ruthenium, tantalum, zirconium, platinum, hafnium, titanium, cobalt, nickel, silicon, and nitrogen.

In another aspect, the invention features a method for forming a structure, the method including providing a substrate comprising a crystalline semiconductor material, and forming a masking layer over the substrate. A window is defined in the masking layer. The window is at least partially filled with a first active area material by selective epitaxy. A second active area material is formed over the first active area material by selective epitaxy. A device including at least a portion of the second active area material is defined.

In another aspect, the invention features a method for forming a structure, the method including providing a substrate comprising a crystalline material, and forming a first masking layer over the substrate. A first opening is defined in the first masking layer to expose a first portion of the substrate in a first region of the substrate. The first opening is filled with a first active area material by selective epitaxy. A first layer including a second active area material is formed over the first active area material by selective epitaxy. A second opening is defined in the first masking layer to expose a second portion of the substrate in a second region of the substrate. The second opening is filled with a third active area material by selective epitaxy. A second layer including a fourth active area material is formed over the third active area material by selective epitaxy. A first device is defined, including at least a portion of the second active area material. A second device is defined, including at least a portion of the fourth active area material.

One or more of the following features may be included. The first device includes a first channel with a first strain, the second device includes a second channel with a second strain, a magnitude of the first strain is approximately equal to a magnitude of the second strain, and a sign of the first strain is opposite a sign of the second strain. The magnitude of the first strain is greater than approximately 1.5%. The first active area material is substantially the same as the fourth active area material. The second active area material is substantially the same as the third active material.

In another aspect, the invention features a structure including a first active area material at least partially filling a window defined in a masking layer disposed over a semiconductor substrate. A second active area material is disposed over the first active area material. A device includes at least a portion of the second active area material.

In another aspect, the invention features a first active area material disposed in a first opening defined in a first masking layer disposed over a crystalline substrate. A first layer comprising a second active area material is disposed over the first active area material. A third active area material is disposed in a second opening defined in the first masking layer. A second layer comprising a fourth active area material disposed over the third active area material. A first device includes at least a portion of the second active area material. A second device includes at least a portion of the fourth active area material.

One or more of the following features may be included. The first and third active area materials are at least partially relaxed and the second and fourth active area materials are substantially strained. The first and third active area materials are approximately fully relaxed. The first device is a transistor including a first source region and a first drain region disposed above the first active area material. The first source region and the first drain region are each disposed within the first layer. The second device is a transistor including a second source region and a second drain region disposed above the third active area material. The second source region and the second drain region are each disposed within the second layer. The first device is an NMOS transistor and the second device is a PMOS transistor. The second active area material includes a III-V semiconductor material and the fourth active area material includes a group IV semiconductor material. The second active area material includes at least one of InP, InAs, InSb, and InGaAs, and the fourth active area material comprises at least one of Si and Ge.

BRIEF DESCRIPTION OF DRAWINGS

FIGS. 1a-1c, 2a-2g, 3a-3d, 4a-4f, 5a-5b, 6a-6b, 7a-7e, 8a-8e, 9a-9e, 10a-10d, 11a-11d, 12b-12c, and 13a-13g are schematic cross-sectional and top views illustrating the formation of alternative semiconductor structures.

Like-referenced features represent common features in corresponding drawings.

DETAILED DESCRIPTION

Figure 1A:
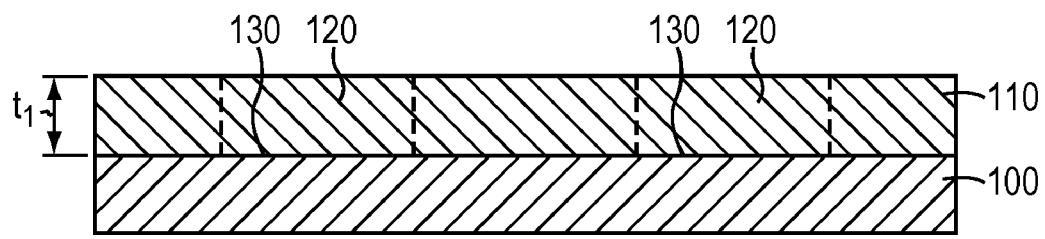

Referring to FIGS. 1a-1c and 2a-2g, planar isolation regions may be utilized for the selective epitaxy of active area materials. Referring to FIGS. 1a, 2a, and 2b, a substrate 100 includes a crystalline semiconductor material. The substrate 100 may be, for example, a bulk silicon wafer, a bulk germanium wafer, a semiconductor-on-insulator (SOI) substrate, or a strained semiconductor-on-insulator (SSOI) substrate. A masking layer 110 is formed over the substrate 100. The masking layer 110 may be an insulator layer including, for example, silicon dioxide, aluminum oxide, silicon nitride, silicon carbide, or diamond, and may have a thickness $t_1$ of, e.g., 50-1000 nanometers (nm). The masking layer 110 may be formed by a deposition method, such as chemical vapor deposition (CVD), plasma-enhanced chemical vapor deposition (PECVD), low pressure chemical vapor deposition (LPCVD), or a physical deposition method such as sputtering. Alternately, the masking layer 110 may be formed by thermal oxidation of the substrate.

A mask (not shown), such as a photoresist mask, is formed over the masking layer 110. The mask is patterned to expose at least a portion of the masking layer 110. The exposed portion of the masking layer 110 is removed by, e.g., reactive ion etching (RIE) to define a window 120 to expose a region 130 of a top surface of the substrate 100. The window 120 may have a width $w_1$ of, e.g., 50 nm-10 micrometers (μm) and a length $l_1$ of, e.g., 50 nm-10 μm. The window has a height $h_1$ equal to the thickness $t_1$ of the masking layer 110. The window 120 corresponds to the active area of the electronic or opto-electronic device into which it will eventually be incorporated, and the dimensions are selected accordingly.

Figure 1B:
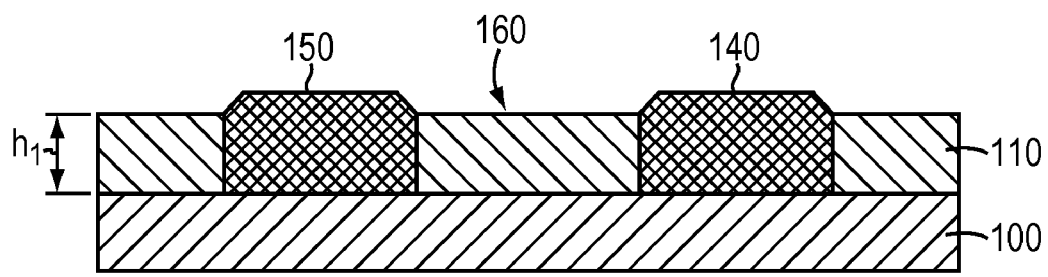

Referring to FIGS. 1b, 2c, and 2d, the window 120 is completely filled with an active area material 140 by selective epitaxy. Selective epitaxy may be performed by a deposition method such as LPCVD, atmospheric pressure CVD (APCVD), ultra-high vacuum CVD (UHCVD), reduced pressure CVD (RPCVD), metalorganic CVD (MOCVD), atomic layer deposition (ALD), or molecular beam epitaxy (MBE). The active area material 140 is formed selectively, i.e., it is formed on the crystalline semiconductor material of substrate 100 exposed by the window 120, but is not substantially formed on the masking layer 110. The active area material 140 is a crystalline semiconductor material, such as a group IV element or compound, a III-V compound, or a II-VI compound The group IV element may be carbon, germanium, or silicon, e.g., (110) silicon. The group IV compound may include silicon, germanium, tin, or carbon, e.g., silicon germanium (SiGe). The III-V compound may be, e.g., gallium arsenide (GaAs), indium arsenide (InAs), indium gallium arsenide (InGaAs), indium phosphide (InP), or indium antimonide (InSb), aluminum antimonide (AlSb), indium aluminum antimonide (InAlSb), or mixtures thereof. The II-VI compound may be, e.g., zinc telluride (ZnTe), cadmium selenide (CdSe), cadmium telluride (CdTe), zinc sulfide (ZnS), or zinc selenide (ZnSe), or mixtures thereof. In some embodiments, more than one active area material 140 can be formed in window 120, i.e., two or more layers of the active area material 140 can be formed by selective epitaxy. Defects may form at an interface between an active area material and the substrate 100. These defects may be trapped by sidewalls of the masking layer 110 defining the window 120, as described in U.S. patent application Ser. Nos. 11/436,198 and 11/436,062, incorporated herein by reference.

After the window 120 is filled with the active area material 140, a portion 150 of the active area material 140 may extend above a top surface 160 of the masking layer 110 for various reasons, thereby forming a non-planar top surface. For instance, facets may form at a vertical interface between the semiconductor active area material and the insulator. Even without facets, a top surface of the active area material 140 may not be co-planar with a top surface of the insulator material, because of the difficulty of stopping reliably and repeatably the selective epitaxy precisely at the point that the window 120 is filled with the active area material 140. A non-planar surface may present subsequent processing difficulties.

Figure 1C:
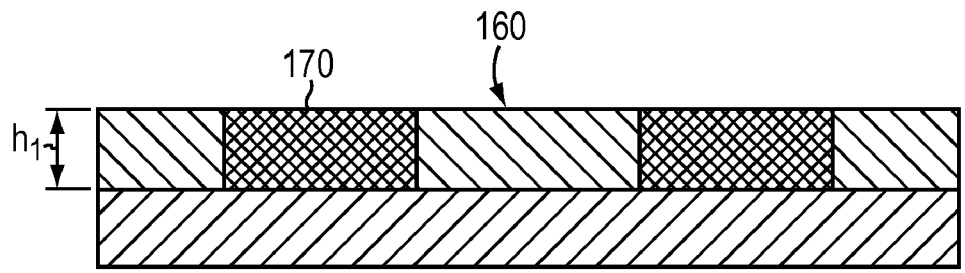

The portion of the active area material 140 extending above the masking layer 110 top surface may be removed by, for example, planarization, so that the active area material surface 170 is substantially coplanar with the top surface 160 of the masking layer 110, as depicted in FIG. 1c. The active area material surface may be planarized by, for example, a chemical-mechanical polishing (CMP) step that is selective with respect to the masking layer 110.

Referring to FIGS. 2e-2g, a device is formed including at least a portion of the active area material. The device may be a transistor 180, with a source 190, a drain 200, and a channel 210 disposed in the active area material. Subsequent processing steps may include the formation of a gate dielectric layer 220, the deposition of a gate electrode material, and the definition of a gate 230 by, e.g., dry etching. The source and drain regions may be defined by an ion implantation step. An interlayer dielectric may be formed over gate, source, and drain, and contact holes may be defined. A metal layer 235 may be deposited in the contact holes and over the structure. The resulting transistor 180 may be, for example, a field-effect transistor (FET), such as a complementary metal-oxide-semiconductor FET (CMOSFET) or a metal-semiconductor FET (MESFET). In an alternative embodiment, the device is a non-FET device such as a diode. The diode device could be a light detecting device (photodiode), or a light emitting device (either a light-emitting diode, or a laser diode). In an alternative application, the device is a bipolar junction transistor.

In an alternative embodiment, the active area material, such as a III-V or II-VI semiconductor alloy, or Ge, or a SiGe alloy, may be introduced only into selected active areas on a wafer, as follows.

Referring to FIGS. 3a-3d, a first shallow trench isolation (STI) region 300 is defined in semiconductor substrate 100 in accordance with methods known to one of skill in the art. The STI region 300 includes a trench 310 filled with a dielectric material 320, such as silicon dioxide or silicon nitride. A thin dielectric layer 330 is formed over the substrate, including the first STI region. In an embodiment, the thin dielectric layer 330 includes the same material as the dielectric material 320. In an alternative embodiment, the thin dielectric layer 330 includes a material different from that of the dielectric material 320. The thin dielectric layer 330 may include $Si_3N_4$ and may have a thickness $t_2$ of, e.g., approximately 100-200 Å. If the $Si_3N_4$ dielectric layer is too thick, it may damage the underlying material, such as silicon, by inducing stress. In an embodiment, the thin dielectric layer 330 includes an $SiO_2$ layer disposed under the $Si_3N_4$ layer. The $SiO_2$ layer alleviates the strain induced by the $Si_3N_4$ layer, and the thickness $t_2$ of the $Si_3N_4$ layer may be, for example, 1000 Å. The thickness of the $SiO_2$ layer may be, for example, 100 Å.

Referring to FIGS. 3a and 3b, a window 335 is defined in the thin dielectric layer 330 to expose a portion 340 of the substrate semiconductor material bound by the first STI region 300, while protecting other substrate portions. The window 335 may be defined by, e.g., a photoresist mask and a wet or a dry etch chemistry that selectively removes a portion of the thin dielectric layer 330 without attacking the underlying substrate semiconductor material. The exposed semiconductor material portion 340 is removed to define an opening 350. The semiconductor material portion 340 may be removed by a wet or dry etch chemistry that selectively removes the semiconductor material, e.g., Si, without attacking either the thin dielectric layer 330 or the STI trench fill material 320. For example, the semiconductor material portion 340 exposed by the window may be removed down to a level even with the bottom boundary of the first STI region 300. The sidewalls 360, 360' of the opening 350 are defined by the dielectric material used to line and/or fill the first STI region 300. In an embodiment, it may be preferable to remove semiconductor material portion 340 down to a level below that of the bottom boundary of the first STI region 300, and the removal process may even undercut first STI region 300, expanding opening 350 below first STI region 300. Such a profile for opening 350 may be advantageous for avoidance of facet formation or for reduction of defects in materials subsequently deposited in opening 350.

Referring to FIG. 3c, the opening 350 is filled with active area material 140 by selective epitaxy. A top surface 370 of the active area material may be planarized such that the active area material is substantially coplanar with a top surface of the thin dielectric layer 330. The planarization may be performed by a CMP step, stopping at the top surface of the thin dielectric layer 330. In some embodiments, more than one active area material 140 can be formed in window 335, i.e., two or more layers of the active area material 140 can be formed by selective epitaxy.

As noted above, the thickness $t_2$ of the thin dielectric layer 330 may be small. An additional benefit of the small thickness $t_2$ is that the active area material extends only slightly above the semiconductor material of the substrate.

Referring to FIG. 3d, the thin dielectric layer 330 is selectively removed, without substantially removing either the STI trench fill 320 or any underlying semiconductor material. For example, in an embodiment in which the thin dielectric layer 330 is $Si_3N_4$, it may be effectively removed with a heated solution comprising phosphoric acid. Optionally, a planarization step, such as CMP, may be used to fully planarize the surface of the structure including the active area material, after the removal of the thin dielectric layer 330, such that the active area material is substantially coplanar with the first STI region and the semiconductor material of the substrate. In the instance of a relatively thick dielectric layer 330, planarization after the removal of that layer may be preferable.

A device, such as a transistor, is defined, including at least a portion of the active area material 140.

Figure 4A:
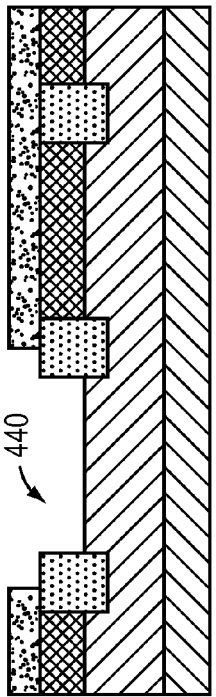

Referring to FIGS. 4a-4f, the crystalline semiconductor material of the substrate may have a first crystalline orientation, and the active area material may include a second crystalline semiconductor material having a second crystalline orientation different from the first crystalline orientation. Referring to FIG. 4a, substrate 100 may include a first layer 400 having a first crystalline orientation, and a bonded layer 410 on the first layer 400 may include a second crystalline material having a second crystalline orientation, with a bonded interface 412 disposed between the two layers. In an embodiment, the first crystalline material of the substrate and the second crystalline material may include the same material having different orientations. For example, the first layer 400 may be (100) Si and the bonded layer may be (110) Si. In an embodiment, substantially all of substrate 100 disposed below bonded layer 410 may consist of first layer 400. For example, first layer 400 may be a (100) Si wafer and bonded layer 410 may be (110) Si.

Figure 4B:
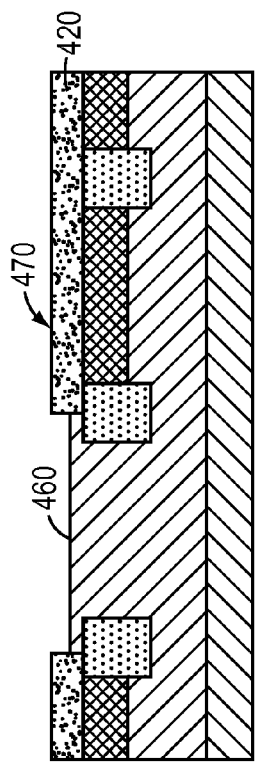

Referring to FIG. 4b, first STI region 300 is defined in the bonded layer 410, extending to the first layer 400. In an embodiment, first STI region 300 may extend into first layer 400. The first STI region 300 bounds a portion 415 of the second crystalline semiconductor material.

Figure 4C:
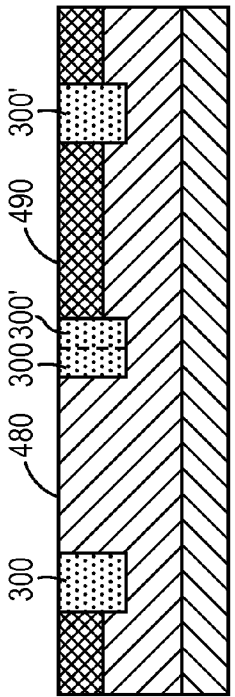

Referring to FIG. 4c, a masking overlayer 420 is defined over the substrate 100. The masking overlayer 420 may be, for example, a thin low-stress $Si_3N_4$ layer with a thickness $t_3$ of, e.g., approximately 100-200 Å. A window 430 is defined in the masking overlayer 420 to expose the second crystalline semiconductor material portion 415 bound by the first STI region 300.

Figure 4D:
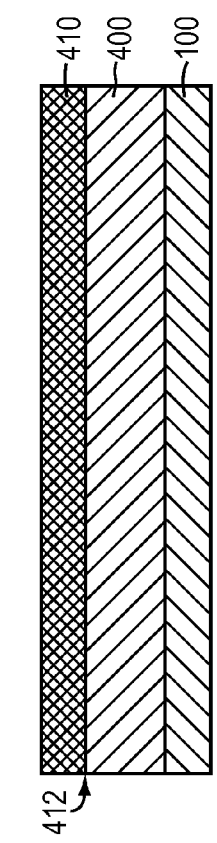

Referring to FIG. 4d, the exposed second crystalline semiconductor material may be removed by a dry or a wet etch to define an opening 440. This removal can be via a non-selective wet or dry etch that is timed to stop after a surface 450 of the first layer 400 is exposed. Alternately, this removal can be selective, via a wet etch that preferentially removes semiconductor material of a given crystalline orientation. For example, a solution of tetramethyl-ammonium-hydroxide (TMAH) at 25% concentration and 70° C. will etch (110) Si very quickly, at about 0.5 µm/min. Since this solution etches (100) Si at only 0.27 µm/min and (111) Si at only 0.009 µm/min, the solution can be used to easily remove (110) Si above a layer of (100) or (111) Si.

Figure 4E:
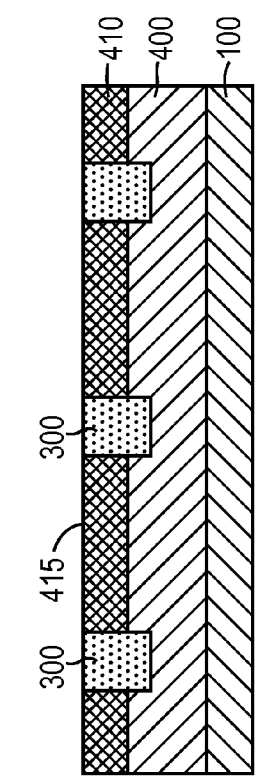

Referring to FIG. 4e, the opening 440 is filled by the first crystalline material by selective epitaxy. A top surface of the selective epitaxial material 460 may be planarized such that it is substantially coplanar with the top surface of bonded layer 410. The planarization may be performed by a CMP step, stopping, for example, at a top surface 470 of the masking overlayer 420.

Figure 4F:
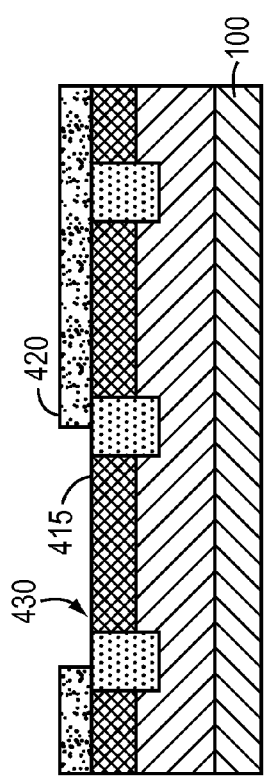

Referring to FIG. 4f, the masking layer is removed, and devices are formed, having active areas comprising the first crystalline material and the second crystalline material, the two crystalline materials having different crystalline orientations.

In an embodiment, the active area 480 of an n-FET is bound by the first STI region 300, and the active area 490 of a p-FET is bound by a second STI region 300' formed in parallel to the formation of the first STI region 300. (110) surface Si has much higher hole mobility than the (100) surface, but the electron mobility of the (110) surface is poorer. It may be advantageous, therefore, to provide (100) Si in the area bound by the first STI region 300 for use as the active area 480 of an n-FET, and to provide (110) Si in the area 490 bound by the second STI region 300' for use as the active area of a p-FET.

In an alternative embodiment, the bonded layer 410 includes (100) Si and is bonded to a wafer including (110) Si. After the STI region 300, 300' formation, the (100) Si is removed from the area bound by the second STI region 300'. (110) Si is selectively grown in the area bound by the second STI region for use as the active area of a p-FET, and planarized. (100) Si bound by the first STI region is used as the active area of an n-FET.

In another alternative embodiment, the bonded layer 410 is (100) strained silicon, transferred from a graded buffer on a second substrate and bonded to a (110) Si wafer. After STI formation, the (100) strained silicon is removed from the area bound by the second STI region 300'. (110) Si is selectively grown in the area bound by the second STI region 300' for use as the active area of a p-FET, and planarized. (100) strained Si bound by the first STI region is used as the active area of an n-FET.

As discussed above, an overlayer masking material, such as masking overlayer 420 or thin dielectric layer 330 may be used to cover certain regions, e.g., p-FET regions, during the selective growth of alternative active area material on uncovered regions, e.g., n-FET regions. Defining the edge of the overlayer masking material is a challenge, because the lithographic step used to define the edge requires a very fine alignment to the STI region. For example, the alignment may need to be within ±10 nm. If the STI region to which the edge is aligned is too narrow in comparison to an alignment tolerance of the lithographic step, misalignment may result.

Figure 5A:
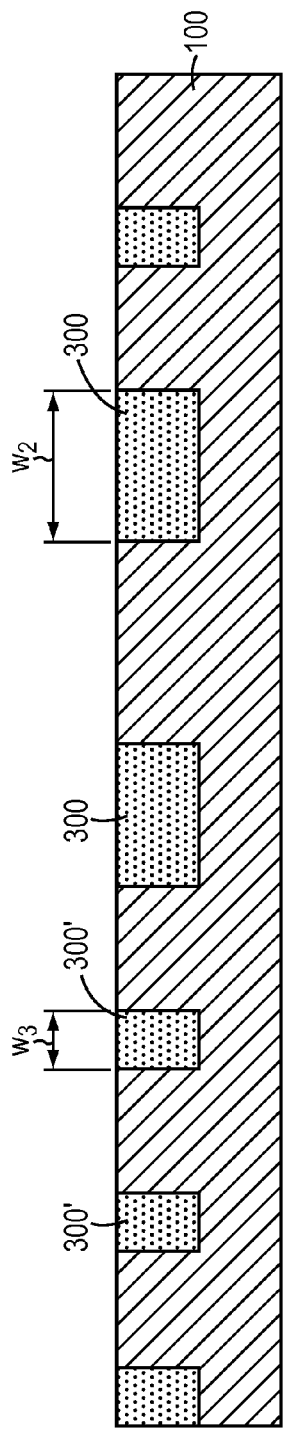
Figure 5B:
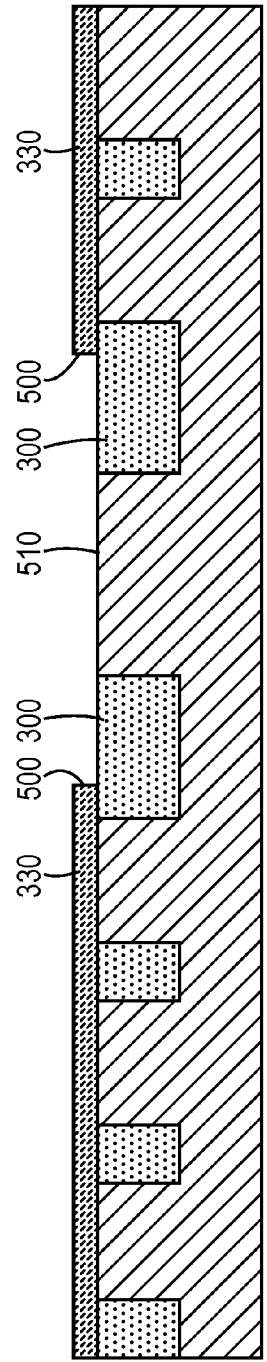

Referring to FIGS. 5a-5b, the first STI region 300 that bounds a region in which an active area will be defined is wider than the second STI region 300' formed on the same substrate 100. For example, STI region 300 may have a width $w_2$ selected from a range of 40 nm to 400 nm, and the second STI region 300' may have a width $w_3$ selected from a range of 20 nm to 200 nm. A ratio of the width of STI region 300 to the width of the second STI region may be greater than 1, preferably selected from the range of 1.2 to 3. The ratio may also be greater than 3, but this may create an excessive area penalty.

Figure 5C:
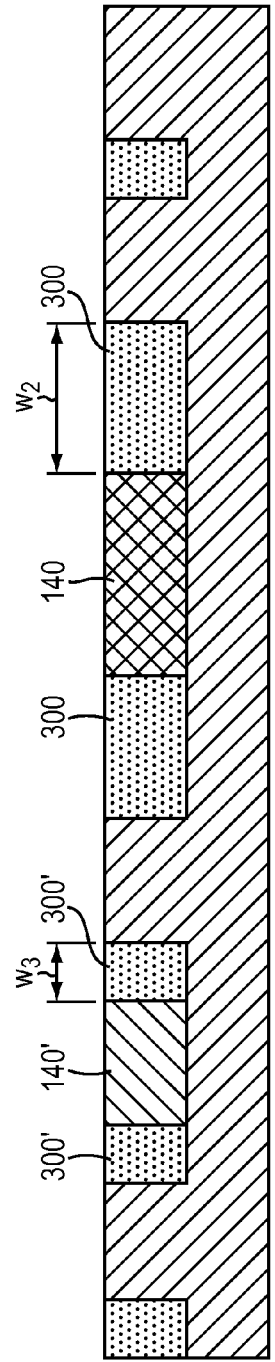

As discussed above with reference to FIGS. 3a-3d, thin dielectric layer 330 is formed and a window is defined. The wider STI region 300 facilitates the alignment of the photoresist mask, such that edges 500 of the thin dielectric layer 330 are more reliably defined over the STI region 300. The substrate semiconductor material 510 exposed by the window is removed to define an opening (not shown). The opening is filled with active area material 140 by selective epitaxy. A top surface of the active area material may be planarized such that the active area material is substantially coplanar with a top surface of the thin dielectric layer 330. The planarization may be performed before and/or after the removal of the thin dielectric layer 330. In the instance of a relatively thick dielectric layer 330, planarization after the removal of that layer may be preferable. In some embodiments, more than one active area material can be formed in the opening, i.e., two or more layers of the active area material can be formed by selective epitaxy. Referring to FIG. 5C, a first active area comprises the first active area material 140 and is bound by a first shallow trench isolation region 300 having a first width $w_2$. A second active area comprises a second active area material 140' and is bound by a second shallow trench isolation region 300' having a second width $w_3$.

Figure 6A:
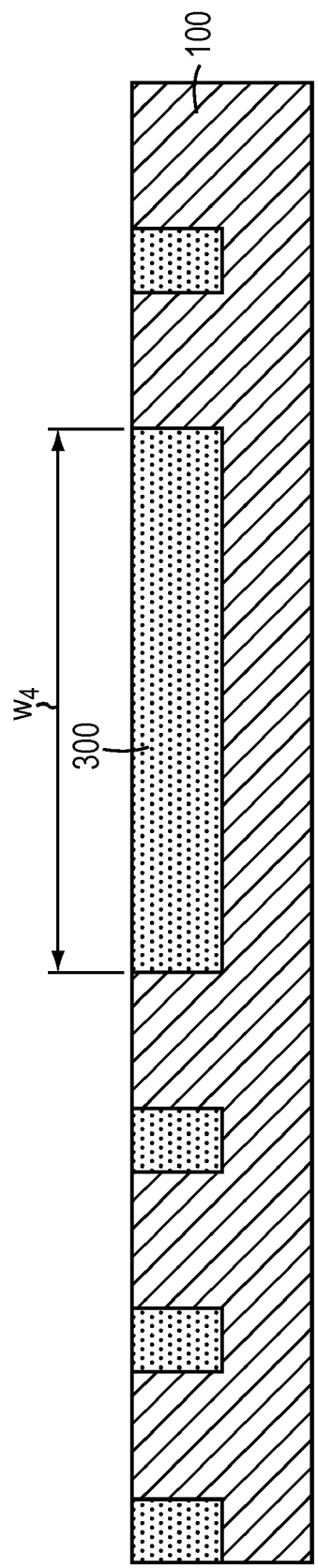
Figure 6B:
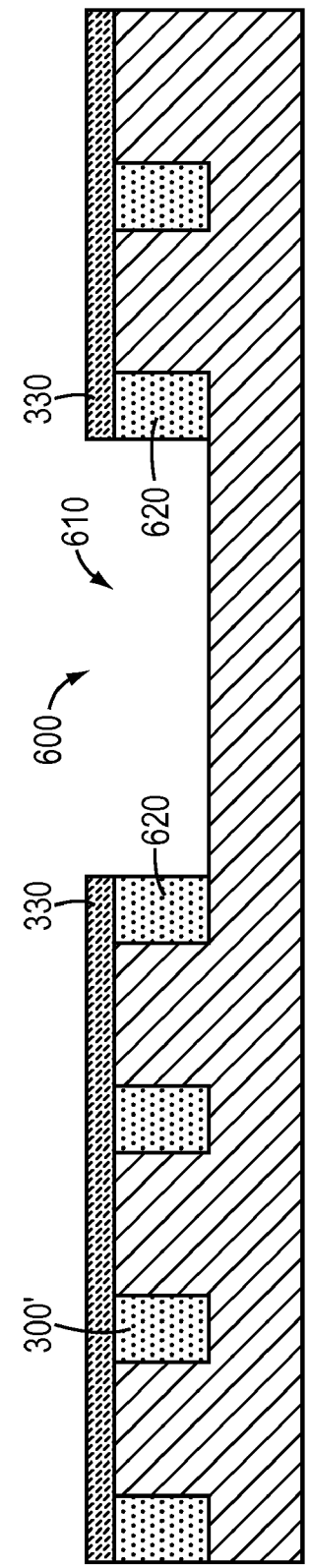
Figure 7A:
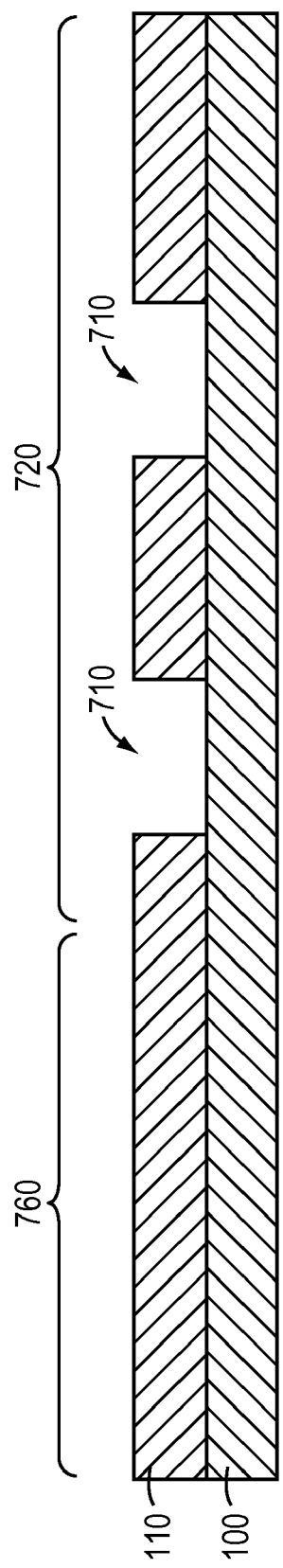
Figure 7B:
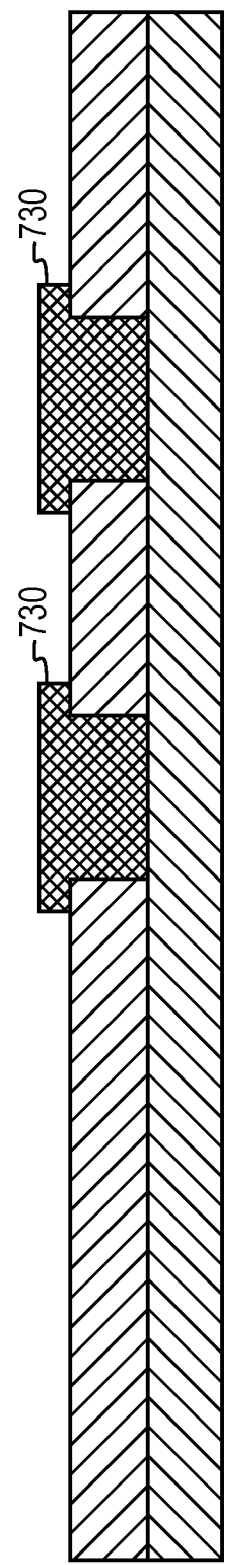
Figure 7C:
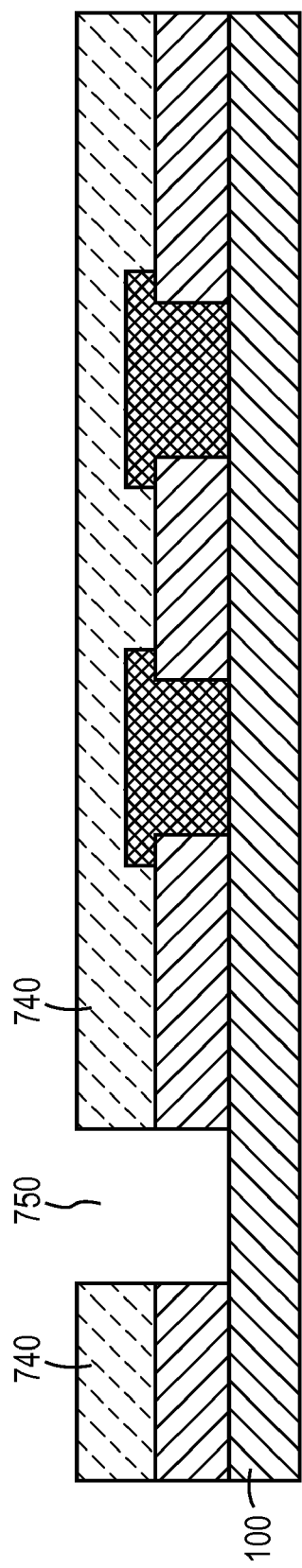
Figure 7D:
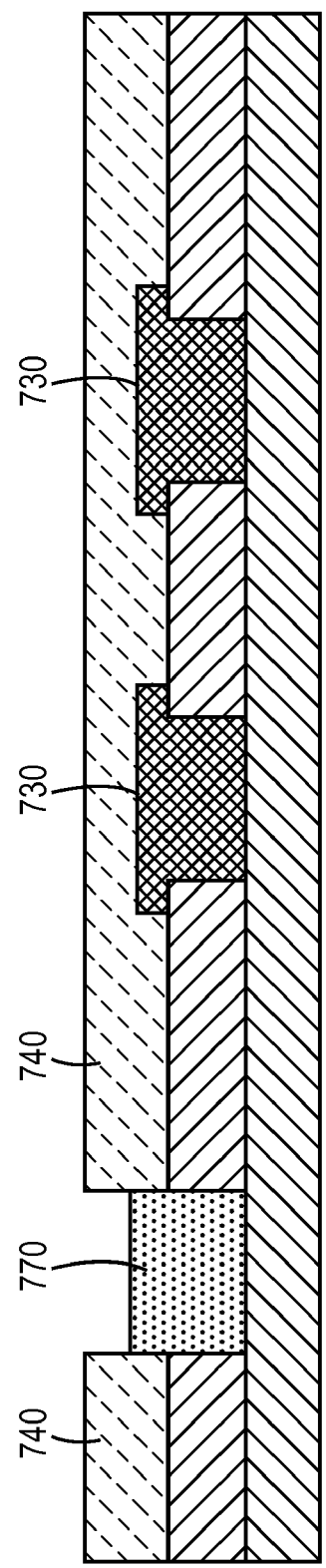
Figure 7E:
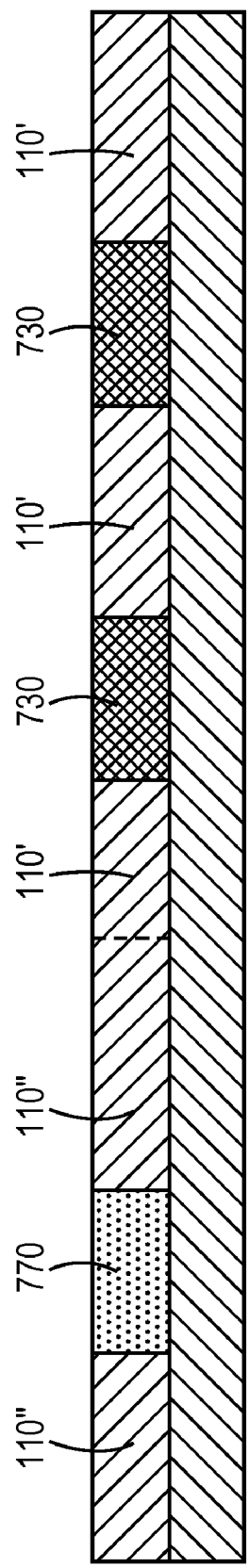
Figure 8A:
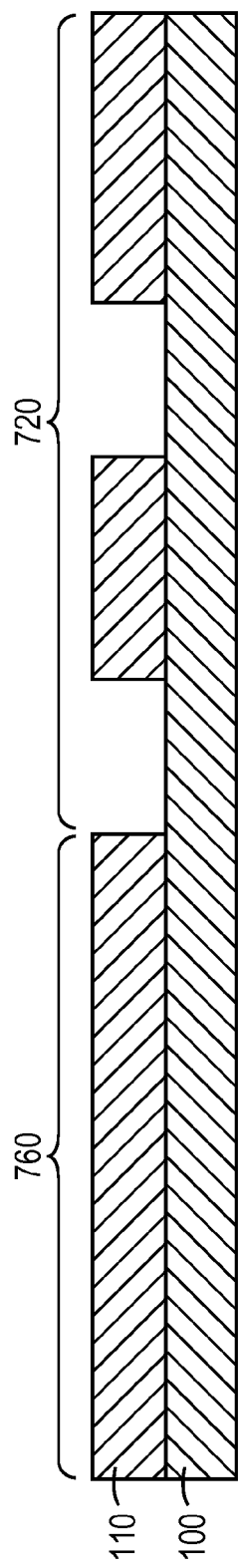
Figure 8B:
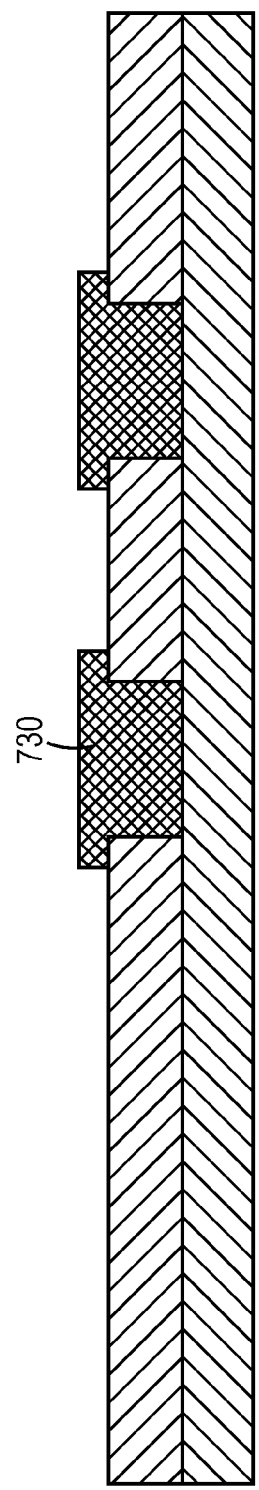
Figure 8C:
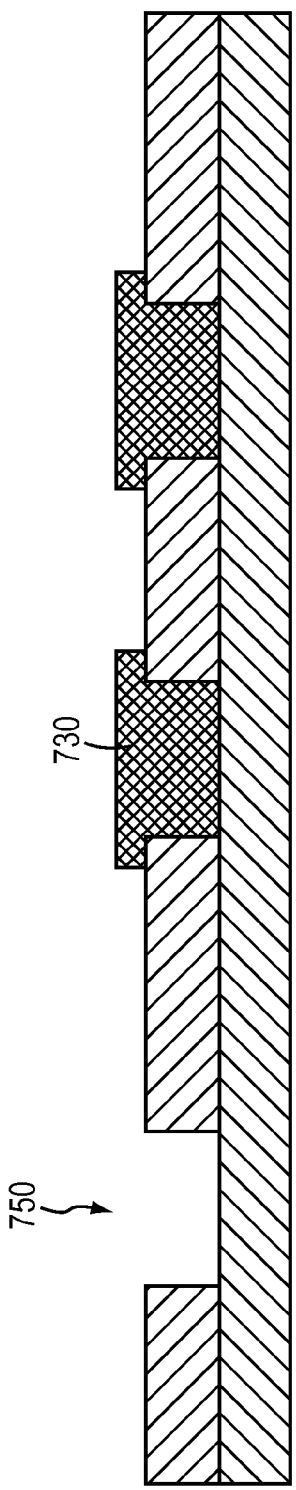
Figure 8D:
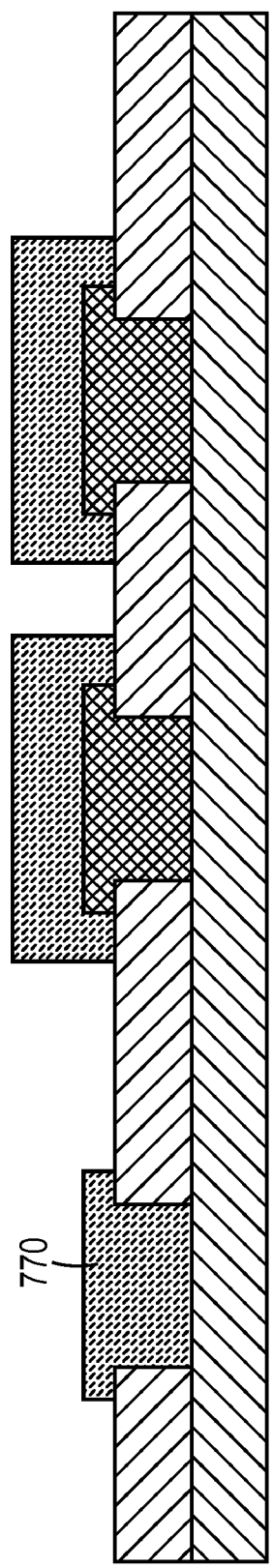
Figure 8E:
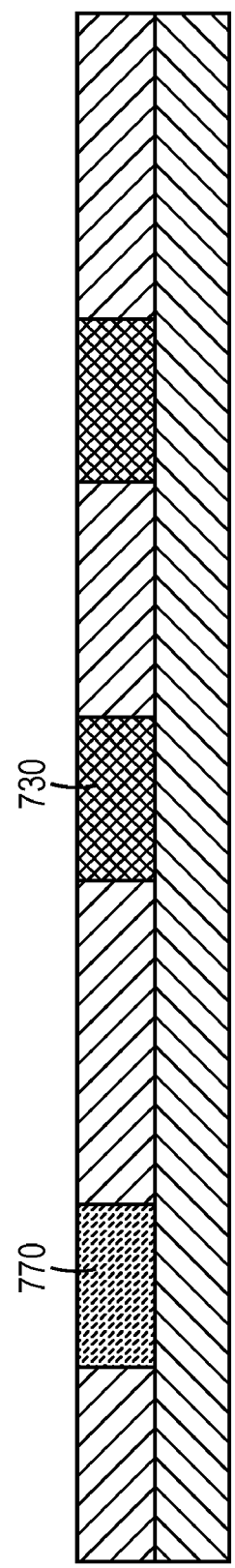

Referring to FIGS. 6a-6b, in an alternative embodiment, first STI region 300 that is wider than an active area is defined in substrate 100 comprising a crystalline semiconductor material. Thin dielectric layer 330 is formed over the substrate, and a window 600 is defined in the thin dielectric layer 330 to expose a portion of the first STI region 300. The exposed portion of the first STI region is removed by, e.g., a dry etch which will not substantially etch silicon, comprising, e.g., HCl and/or HBr, to define an opening 610. The opening 610 is filled with an active area material (not shown) by selective epitaxy. A top surface of the active area material may be planarized such that the active area material is substantially coplanar with a top surface of the thin dielectric layer 330. The planarization may be performed before and/or after the removal of the thin dielectric layer 330. In some embodiments, more than one active area material can be formed in the opening 610, i.e., two or more layers of the active area material can be formed by selective epitaxy.

The remaining insulator strips 620 around the periphery of the opening will function as isolation structures. A ratio of the width of these strips to a width of a second STI region 300' may be greater than 1.

The thin dielectric layer is removed 330, and a device is defined including at least a portion of the active area material.

The first STI region 300 has a width $w_4$ of, e.g., the sum of the equivalent of the active area (typically a minimum of ten times the gate length) and two times a trench width (each typically two times a gate length). Thus, for a subsequently formed device with a gate length of 45 nm, the first STI region 300 may have a width of 630 nm.

Referring to FIGS. 7a-7e, two or more different active area materials may be selectively grown on a single substrate. A masking layer 110 is formed over substrate 100, which includes a crystalline material as described above. The masking layer 110 includes a non-crystalline material, such as a dielectric, e.g., $SiO_2$ or $Si_3N_4$. The masking layer 110 may act as an isolation region. A first opening 710 is defined in the first masking layer to expose a first portion of the substrate in a first region 720 of the substrate. The first opening 710 may be defined by a wet or a dry selective etch.

The first opening is filled with a first active area material 730 by selective epitaxy, such that the first active area material forms in the first opening 710, but is not substantially formed on the masking layer 110. In some embodiments, more than one active area material can be formed in the first opening 710, i.e., two or more layers of the active area material can be formed by selective epitaxy.

A second masking layer 740 may be formed over the substrate such that the first region of the substrate is covered. The second masking layer 740 includes a non-crystalline material, such as a dielectric. A second opening 750 is defined in the second and first masking layer to expose a second portion of the substrate in a second region 760 of the substrate. The second opening is filled with a second active area material 770 by selective epitaxy. The second masking layer 740 prevents the second active area material 770 from forming by selective epitaxy on the crystalline first active area material 730. The second masking layer may be removed by, e.g., a selective wet etch, after the second opening is filled with the second active area material. In some embodiments, more than one active area material can be formed in the second opening 750, i.e., two or more layers of the active area material can be formed by selective epitaxy.

Thus, the structure may include first isolation region 110', first active area comprising a first active area material 730 and bound by the first isolation region 110', second isolation region 110", and second active area comprising a second active area material 770 different from the first active area material and bound by the second isolation region 110". Preferably, a surface of the first active area material 730, a surface of the second active area material 770, a surface of the first isolation region 110', and a surface of the second isolation region 110" are all substantially coplanar.

Each of the first and second active area materials 730, 770 may be formed in the manner discussed above with respect to active area material 140, and may include any of the listed materials. In an embodiment, the first active area material has a first crystalline orientation and the second active area material has a second crystalline orientation different from the first crystalline orientation. In some embodiments, the first active area material may include at least one of a group IV element or compound, such as Si or Ge or SiGe, or a III-V compound, such as InAs, InGaAs, InSb, AlSb, InAlSb, GaAs, and InP, and the second active area material may include at least one of a group IV element or compound, such as Si or Ge or SiGe, or a III-V compound, such as InAs, InGaAs, InSb, AlSb, InAlSb, GaAs, and InP.

After the removal of the second masking layer, a surface of the first active area material and a surface of the second active area material may be planarized by, e.g., CMP. This CMP step enables the non-selective polishing of two different materials by polishing both the first active area material and the second active area material at the same rate.

By further processing, a first device including the first active area is formed, and a second device including the second active area is formed.

In this way, two types of alternative active area materials may be formed on a substrate for use in electronic or optoelectronic devices. For example, a first active area material may be suitable for use as the active area of an n-FET, e.g., InGaAs, and the second active area material may be suitable for use as the active area of a p-FET, e.g., Si, Ge, or SiGe.

Referring also to FIGS. 8a-8e, in an embodiment, no second masking layer 740 is formed prior to the formation of the second active area material. Thus, after the filling of the first opening with the first active area material 730, the second opening 750 in the first masking layer 110 is defined and filled with the second active area material 770. The second active area material 770 is formed by selective epitaxy, which results in the second active area material being formed on all exposed crystalline surfaces, including a top surface of the first active area material. After formation of the second active area material 770, the structure may be planarized by, e.g., CMP.

Referring to FIG. 9a-9e, different transistors in a CMOS circuit may have different active area materials. The design and processing challenges of the incorporation of two types of active area materials in a single substrate may be reduced by the use of a single source/drain material for both n- and p-FET. Moreover, the described structure allows a CMOS circuit to include an n-FET with a channel having a first type of stress and a p-FET with a channel having a second type of stress, which may be beneficial for various channel material combinations.

As explained above, in some instances, two different active area materials may be preferable for the formation of different types of devices on a single substrate. For example, a CMOS device 900 may include (i) an n-FET 905 that has a first channel 910 disposed in a first active area material 915, such as Ge, GaAs, InAs, InSb, or InGaAs, a first source region 920, and a first drain region 925; and (ii) an p-FET 930 may have a second channel 940 disposed in a second active area material 935, such as SiGe, Ge, Si with a (110) surface, or InSb, a second source region 945, and a second drain region 950.

The CMOS device 900 may be formed as follows. The first active area material 915, suitable for use as first channel 910 of the n-FET 905, is provided in a first region 955 of semiconductor substrate 100. The second active area material 935, suitable for use as second channel 940 of the p-FET 930, is provided in a second region 960 of semiconductor substrate 100.

Figure 9A:
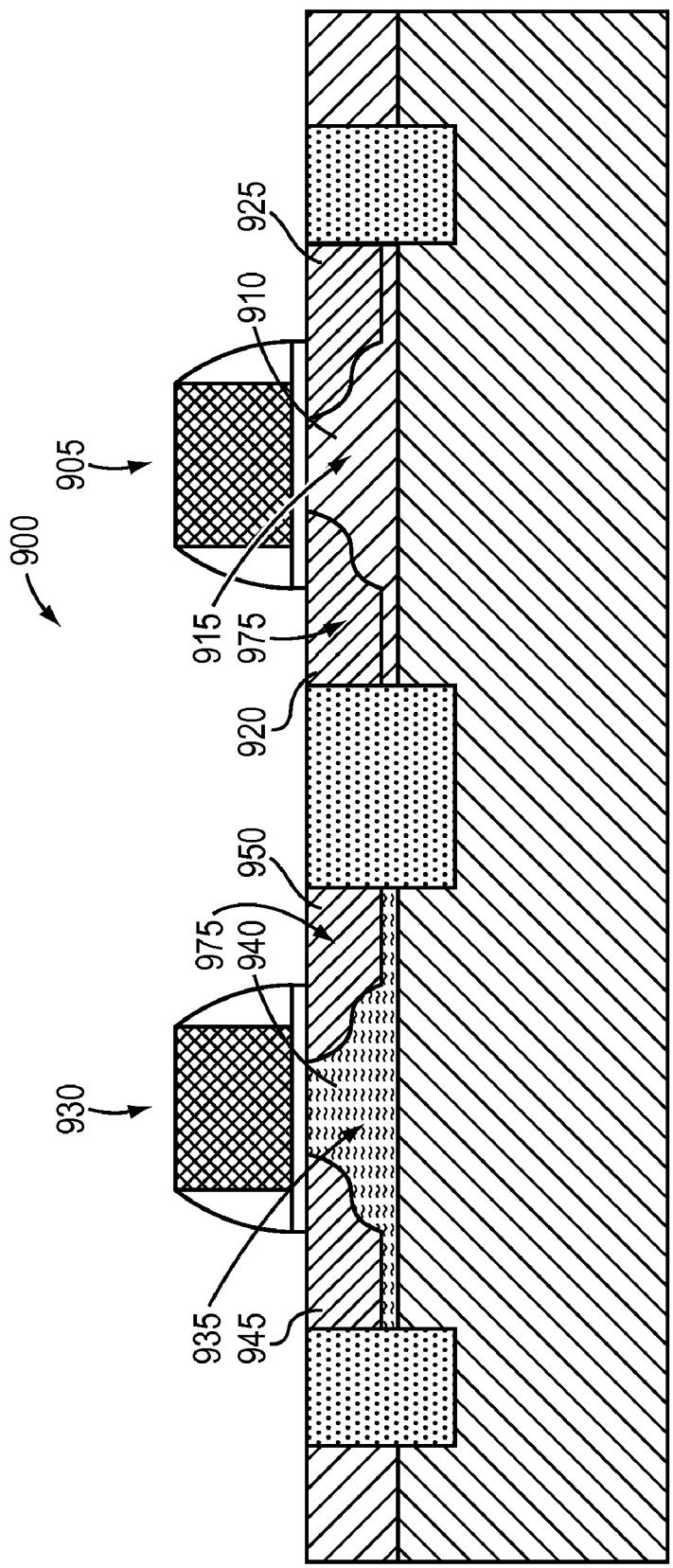
Figure 9B:
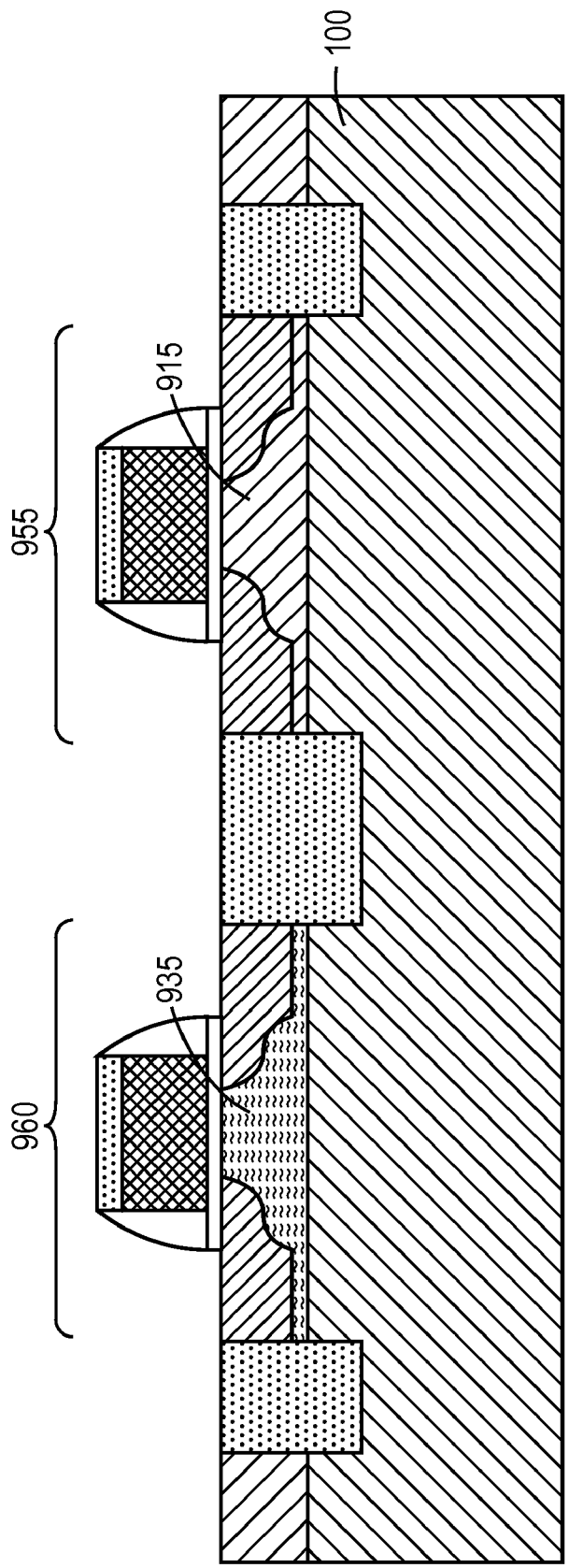
Figure 9C:
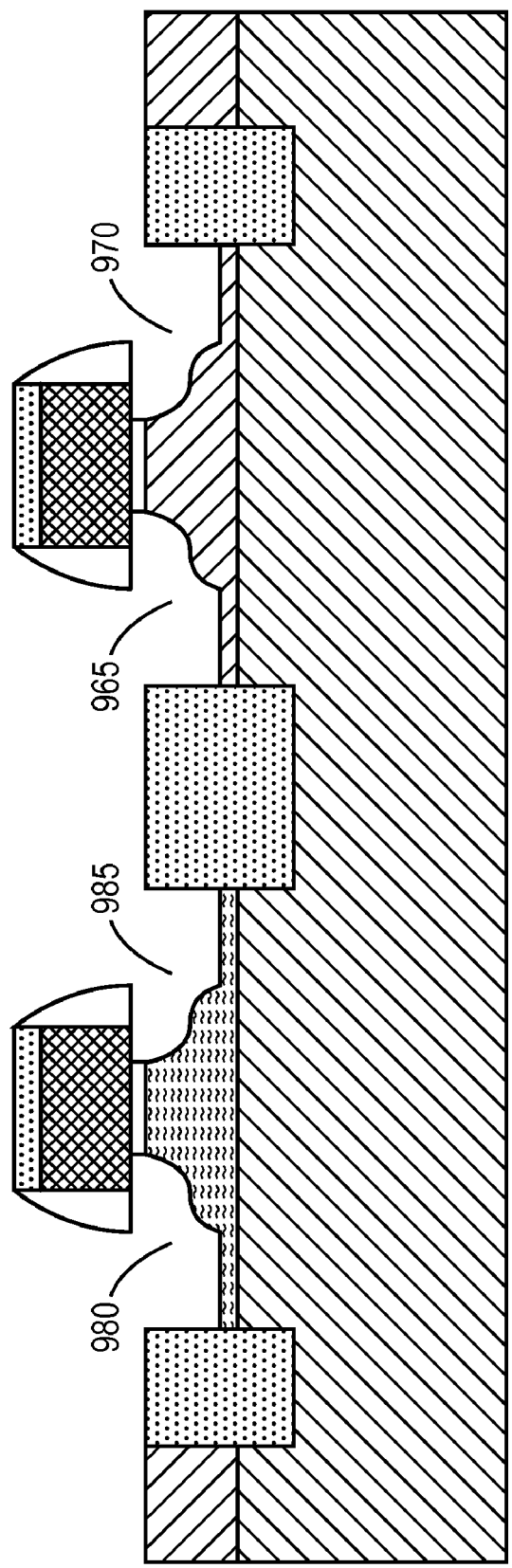
Figure 9D:
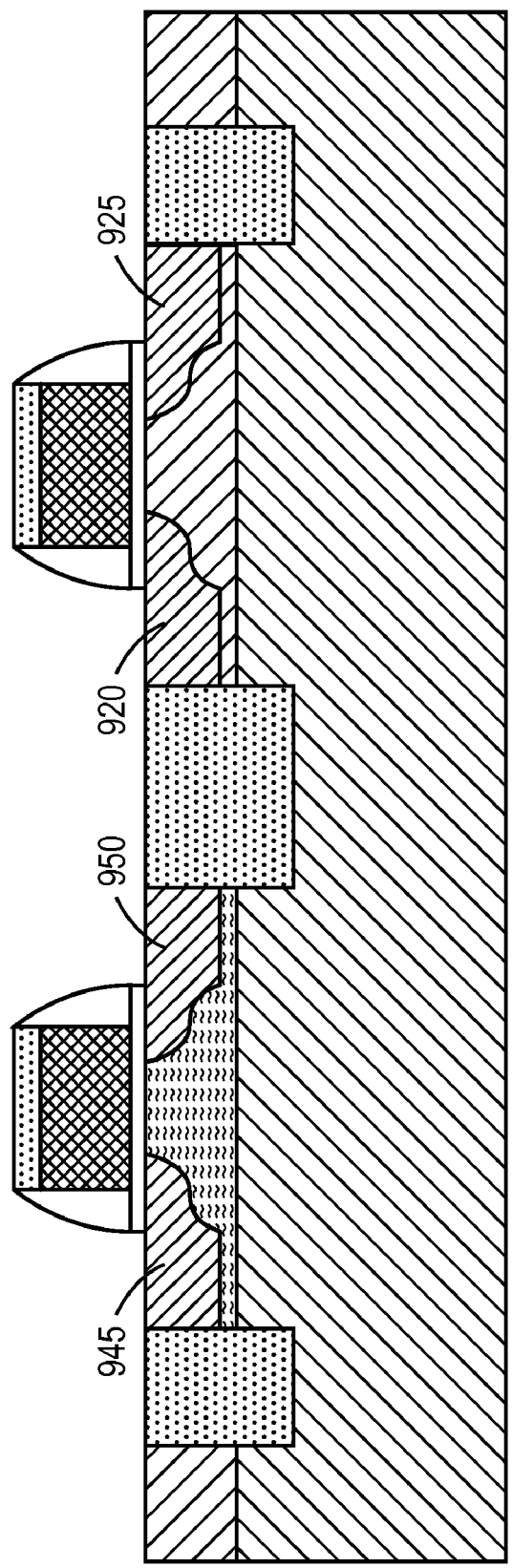
Figure 9E:
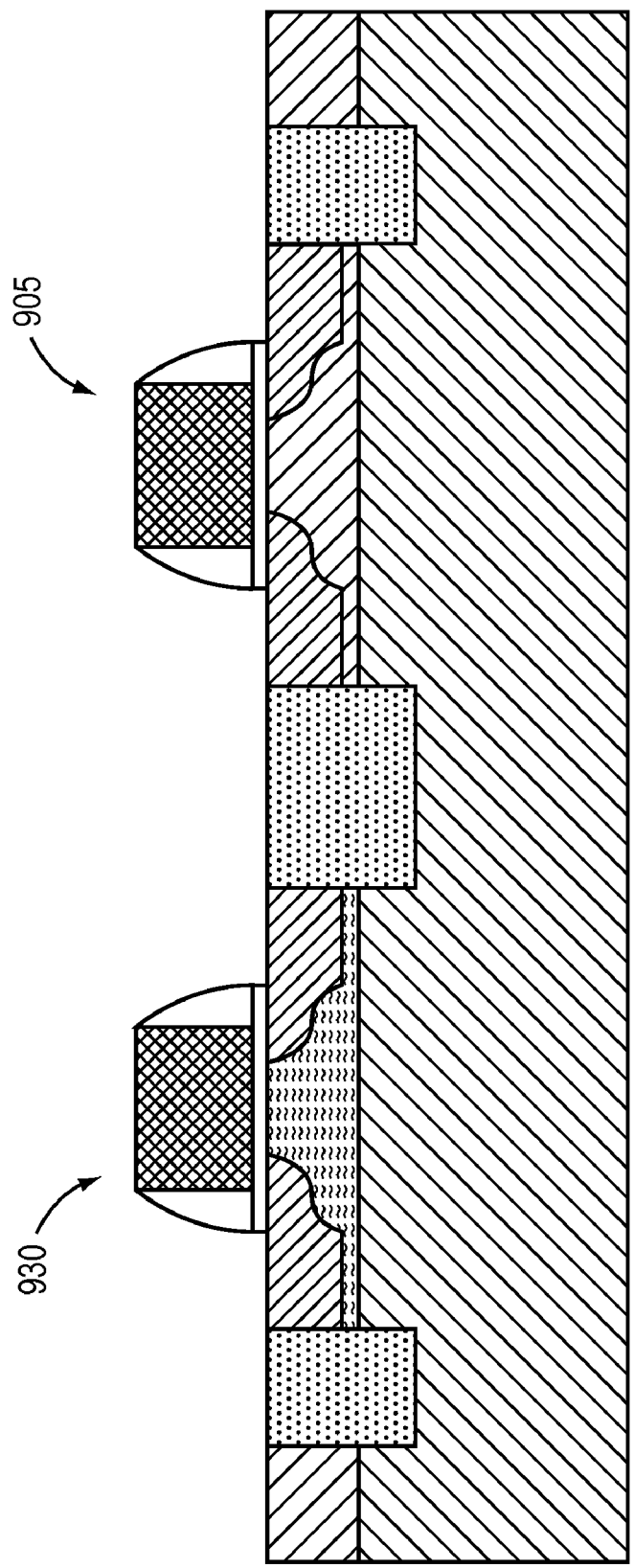
Figure 10A:
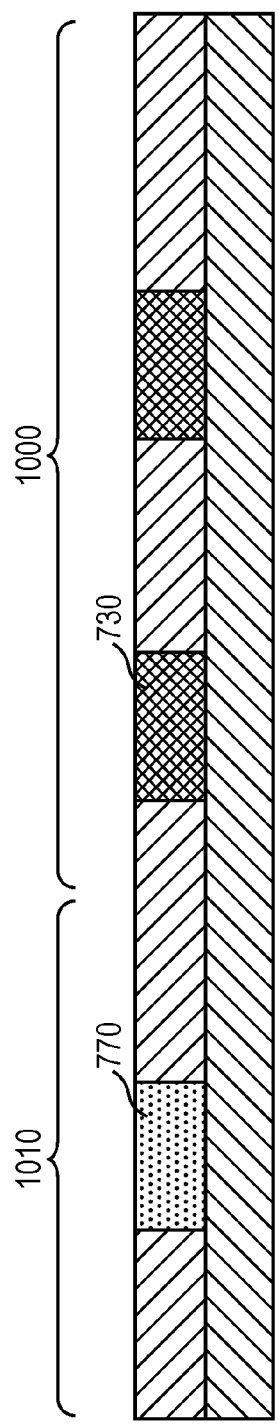
Figure 10B:
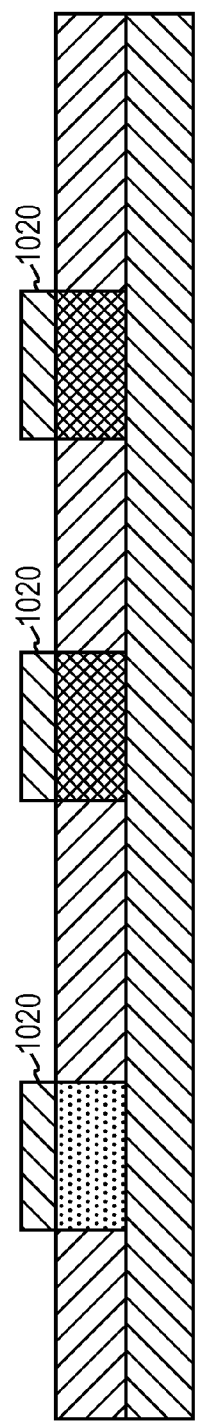
Figure 10C:
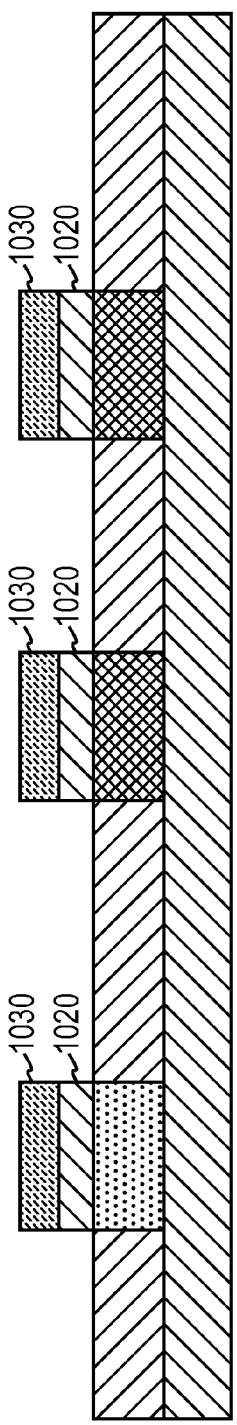
Figure 10D:
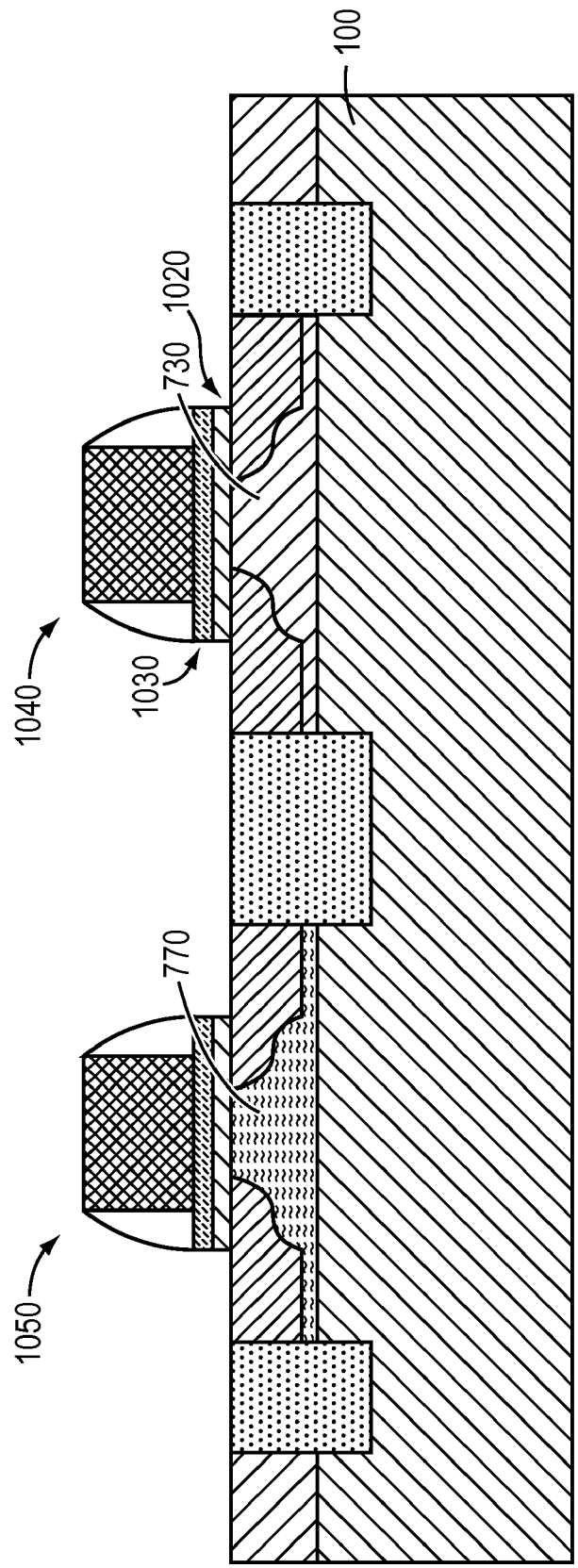

Referring to FIGS. 9c and 9d, the first source and the first drain regions 920, 925 are defined by first defining a first and a second recess 965, 970 by removing a first portion and a second portion of the first active area material 915, and then depositing a source/drain material into the first and second recesses. Subsequently or, preferably in parallel, the second source and the second drain regions 945, 950 are defined by first defining a third and a fourth recess 980, 985 by removing a first portion and a second portion of the second active area material 935, and then depositing a source/drain material into the third and fourth recesses.

The recesses may be formed by a suitable wet or dry etch. For example, the first, second, third, and fourth recesses 965, 970, 980, 985 may be formed by a non-selective etch that removes the first and second active area materials at approximately the same rate. For example, a dry etch with a 45% $SF_6$/55% $O_2$ chemistry [with total gas pressure of 100 milliTorr (mTorr), RF power of 50 Watts, and total gas flow rate of 30 standard cubic centimeters per minute (sccm)] may be used to etch active areas that include Si and Ge at approximately the same rate of 200 nm/min. (See A. Campo, et al., "Comparison of Etching Processes of Silicon and Germanium in $SF_6$—$O_2$ Radio-Frequency Plasma," *J. Vac. Sci. Technol. B*, Vol. 13, No. 2, p. 235, 1995, incorporated herein by reference.) Alternatively, the first and second recesses 965, 970 in the first active material may be defined by an etch that is highly selective with respect to the second active material. Similarly, the third and fourth recesses 980, 985 may be removed by an etch that is highly selective with respect to the first active material. For example, if the first active area material is Si and the second active area material is Ge, the first and second recesses 965, 970 in the Si material may be created with a $SF_6$/$H_2$/$CF_4$ etch chemistry. Gas flows of 35 sccm for $SF_6$, 65 sccm for $H_2$, and 80 sccm for $CF_4$, a pressure of 150 mTorr and RF power of 50 Watts enable this chemistry to etch Si at approximately 10 nm/min with complete selectivity to Ge. (See G. S. Oehrlein, et al., "Studies of the Reactive Ion Etching of SiGe alloys," *J. Vac. Sci. Technol. A*, Vol. 9, No. 3, p. 768, 1991, incorporated herein by reference.) The third and fourth recesses 980, 985 may then be created with an HCl etch chemistry, at a total pressure of 20 Torr and an HCl partial pressure of 208 mTorr (in $H_2$ carrier gas). At an etch temperature of 500-600° C., this chemistry etches Ge at 10-20 nm/min with complete selectivity to Si. (See Y. Bogumilowicz, et al., "Chemical Vapour Etching of Si, SiGe and Ge with HCl; Applications to the Formation of Thin Relaxed SiGe Buffers and to the Revelation of Threading Dislocations," *Semicond. Sci. Technol.*, Vol. 20, p. 127, 2005, incorporated herein by reference.)

The source/drain material deposited into the first source and drain regions 920, 925 is the same as the source/drain material deposited into the second source and drain regions 945, 950. By selecting source/drain materials with appropriate lattice constants, desired types of stress may be induced in the active area materials. For example, the first active area material may be under tensile strain, and/or the second active area material may be under compressive strain. In an embodiment, the channel 940 of the p-FET 930 is compressively strained and the channel 910 of the n-FET 905 is tensilely strained; thus, for the case of channel materials comprising, for example, Si, SiGe, or Ge the carrier mobilities of both devices are enhanced. Here, the source/drain material has a lattice constant that is smaller than a lattice constant of the first active area material of the n-FET channel. Hence, the n-FET channel is tensilely strained. The lattice constant of the source/drain material is larger than a lattice constant of the second active area material of the p-FET channel. Hence, the p-FET channel is compressively strained. More particularly, the first active area material may be Ge, the second active area material may be Si, and the source/drain material may be SiGe.

In another embodiment, the first active area material may be under compressive strain, and/or the second active area material may be under tensile strain. Therefore, the channel 940 of the p-FET 930 is tensilely strained and the channel 910 of the n-FET 905 is compressively strained. Here, the source/drain material has a lattice constant that is larger than a lattice constant of the first active area material of the n-FET channel.

Hence, the n-FET channel 910 is compressively strained. The lattice constant of the source/drain material is smaller than a lattice constant of the second active area material of the p-FET channel 940. Hence, the p-FET channel 940 is tensilely strained. More particularly, the first active area material may be Si, the second active area material may be Ge, and the source/drain material may be SiGe.

The type of strain that may be beneficial for device performance may be determined from piezoresistance coefficients. A relatively large positive piezoresistance coefficient is an indicator that compressive strain will enhance carrier mobilities. A relatively large negative piezoresistance coefficient is an indicator that tensile strain will enhance carrier mobilities. For example, the piezoresistance coefficient for <110> Si for p-type devices is 71.8, as measured in parallel to current flow. Hence compressive strain will help increase carrier mobilities in p-type devices having <110>-oriented Si channels. The piezoresistance coefficient for <110> Ge for n-type devices is −72, as measured in parallel to current flow. Hence, tensile strain will help increase carrier mobilities in n-type devices having <110>-oriented Ge channels. In an embodiment, CMOS device 900 includes n-FET 905 having a <110>-oriented Ge tensilely strained channel 910, and p-FET 930 with a <110>-oriented Si compressively strained channel 940, and a source/drain material of $Si_xGe_y$.

In an embodiment, at least a portion of the source/drain material in the first source and first drain regions 920, 925 is disposed in a first and a second recess 965, 970, at least a portion of the source/drain material in the second source and second drain regions 945, 950 is disposed in a third and a fourth recess 980, 985, and a lattice constant of the source/drain material is smaller than a lattice constant of the first active area material 915 and larger than a lattice constant of the second active area material 935. In another embodiment, a lattice constant of the source/drain material is larger than a lattice constant of the first active area material 915 and smaller than a lattice constant of the second active area material 935.

Alternatively, at least a portion of the source/drain material in the first source and first drain regions 920, 925 is disposed in a first and a second recess 965, 970, the source/drain material in the second source and second drain regions 945, 950 is disposed on a top surface of the second active area material, and a lattice constant of the source/drain material is smaller than a lattice constant of the first active area material 915 and smaller than a lattice constant of the second active area material 935. In this case, third and fourth recesses 980, 985 are not formed before deposition of the source/drain material because additional strain on p-FET 930 is not desired or may even deleteriously affect performance of p-FET 930. The source/drain material may include a group IV semiconductor, such as Si, Ge, SiGe, or SiC.

In yet another embodiment, the source/drain material in the first source and first drain regions 920, 925 is disposed on a top surface of the first active area material, at least a portion of the source/drain material in the second source and second drain regions 945, 950 is disposed in a third and a fourth recess 980, 985, and a lattice constant of the source/drain material is larger than a lattice constant of the first active area material 915 and larger than a lattice constant of the second active area material 935. In this case, first and second recesses 965, 970 are not formed before deposition of the source/drain material because additional strain on n-FET 905 is not desired or may even deleteriously affect performance of n-FET 905.

With subsequent processing, a first device, such as n-FET 905, is defined, having a channel 910 disposed in the first active area material between the first source 920 and the first drain 925. Also, a second device, such as a p-FET 930, is defined, having a channel 940 disposed in the second active area material between the second source 945 and the second drain 950.

The design and fabrication of CMOS devices having different n- and p-active areas may be simplified by the use of a single gate dielectric material for both n- and p-type devices.

Referring to FIGS. 10a-10d, first active area material 730 is provided over a first portion 1000 of substrate 100, and second active area material 770 is provided over a second portion 1010 of substrate 100, as discussed above with reference to FIGS. 7a-7e. The first and second active area materials may each include, for example, at least one of Ge, SiGe, SiC, diamond, III-V semiconductors, and II-VI semiconductors.

A very thin layer 1020, e.g., of thickness t=5-20 Å is deposited over both the first and the second active area materials so that a top surface of each active material includes the same material. This deposition may be selective, i.e., such that deposition occurs on the active area materials, but not on the surface of the isolation regions surrounding the active areas. This thin layer 1020 may include, e.g., Si, Ge, or another material selected for its high quality interface properties with a particular gate dielectric. This thin layer 1020 may be deposited by, e.g., a method such as ALD, that allows for very fine thickness control. A gate dielectric layer 1030 is thereafter formed over the thin layer 1020. In an embodiment, the thin layer 1020 includes Si and the gate dielectric layer 1030 includes thermally grown $SiO_2$. Alternatively, the gate dielectric layer 1030 may include SiON, $Si_3N_4$, or a deposited high-k dielectric, such as hafnium oxide ($HfO_2$), aluminum oxide ($Al_2O_3$), or zirconium oxide ($ZrO_2$).

A first device 1040 is formed including the first active area material 730 and a second device 1050 is formed including the second active area material 770. For example, the first device 1040 may be an n-FET and the second device 1050 may be a p-FET.

The performance, design and fabrication of CMOS devices having different n- and p-active areas may be improved by the use of different gate electrode materials for the n- and p-type devices, selected, e.g., in view of work-function considerations.

Referring to FIGS. 11a-11d, first active area material 730 is provided over a first portion 720 of substrate 100, and second active area material 770 is provided over a second portion 760 of substrate 100, as discussed above with reference to FIGS. 7a-7e. Gate dielectric layer 1030 is formed over the substrate 100, either directly over both of the first and second active areas, or by first forming the thin layer 1020 as described above with reference to FIGS. 10a-10c. In an embodiment, a first gate dielectric layer is formed over the first active area material 730 and a second gate dielectric layer is formed over the second active area material 770. For example, the second active area material may be masked by a dielectric masking layer such as $SiO_2$ or $Si_3N_4$, and the first gate dielectric layer is formed over only exposed first active area material 730 by a method such as oxidation, nitridation, or atomic layer deposition. Either before or after deposition of a gate electrode material on the first active area (described below), the masking material may be removed from the second active area and applied to the first active area. The second gate dielectric layer may then be formed over only exposed second active area material 770 by a method such as oxidation, nitridation, or atomic layer deposition. The masking material may then be removed. In an embodiment, the first and second gate dielectric layers are formed from the same material and are formed in a single step.

A first gate electrode material 1100 is deposited over the substrate 100, including over the first active area material 730. The first gate electrode material 1100 may be suitable for use as a gate of an n-FET device, and may include, for example, indium (In), tantalum (Ta), zirconium (Zr), tungsten (W), molybdenum (Mo), chromium (Cr), tin (Sn), zinc (Zn), cobalt (Co), nickel (Ni), rhenium (Re), ruthenium (Ru), platinum (Pt), titanium (Ti), hafnium (Hf), alloys of one or more of the aforementioned materials, and alloys of one or more of the aforementioned materials with Si and/or nitrogen. Referring to FIG. 11*b*, the first gate electrode material 1100 disposed over the second active area material 770 may be removed, e.g., by a wet or dry etch highly selective to the underlying gate dielectric layer. A suitable dry etch may be $XeF_2$ at 2.6 mTorr, which will etch Ti, Ta, Mo, and W but is very selective to most oxides. (See K. R. Williams, et al., "Etch Rates for Micromachining Processing-Part II," *J. Micromechanical Systems*, Vol. 12, No. 6, p. 761, 2003, incorporated herein by reference.)

Referring to FIG. 11*c*, a second gate electrode material 1110 is deposited over the substrate 100, including over the second active area material 770. The second gate electrode material 1110 may be suitable for use as a gate of a p-FET device, and may include, for example, copper (Cu), Mo, Cr, W, Ru, Ta, Zr, Pt, Hf, Ti, Co, Ni, alloys of one or more of the aforementioned materials, and alloys of one or more of the aforementioned materials with Si and/or nitrogen. The second gate electrode material 1110 disposed over the first active area material 730 may be removed, e.g., by a wet or dry etch highly selective to the underlying first gate electrode material. For example, for the case of a first gate electrode material of tungsten (W) and a second gate electrode material of titanium (Ti), a room-temperature wet etch solution of 10:1 $H_2O$:HF can be used to remove the Ti at a rate of approximately 1100 nm/minute, while stopping selectively on the W that is etched at a rate at least 100 times slower. (See K. R. Williams et al., "Etch rates for micromachining processes" *J. Microelectromech. Syst.* 5, p 256-269, 1996, incorporated herein by reference). Alternatively, the second gate electrode material 1110 disposed over the first active area material 730 may be removed by a planarization step, such as CMP.

Referring to FIG. 11*d*, the first and second gate electrode layers 1100, 1110 disposed over the substrate 100 are planarized to define a co-planar surface 1130 including a surface of the first electrode layer 1100 disposed over the first active area material 730 and a surface of the second electrode layer 1110 disposed over the second active area material 770. In an embodiment, the first gate electrode material 1100 may be used as a CMP stop for the second gate electrode material.

A first gate may be defined over the first active area material and a second gate may be defined over the second active area material. A first device, such as an n-FET is defined, including the first active area material, and a second device, such as a p-FET is defined, including the second active area material.

Figure 12A:
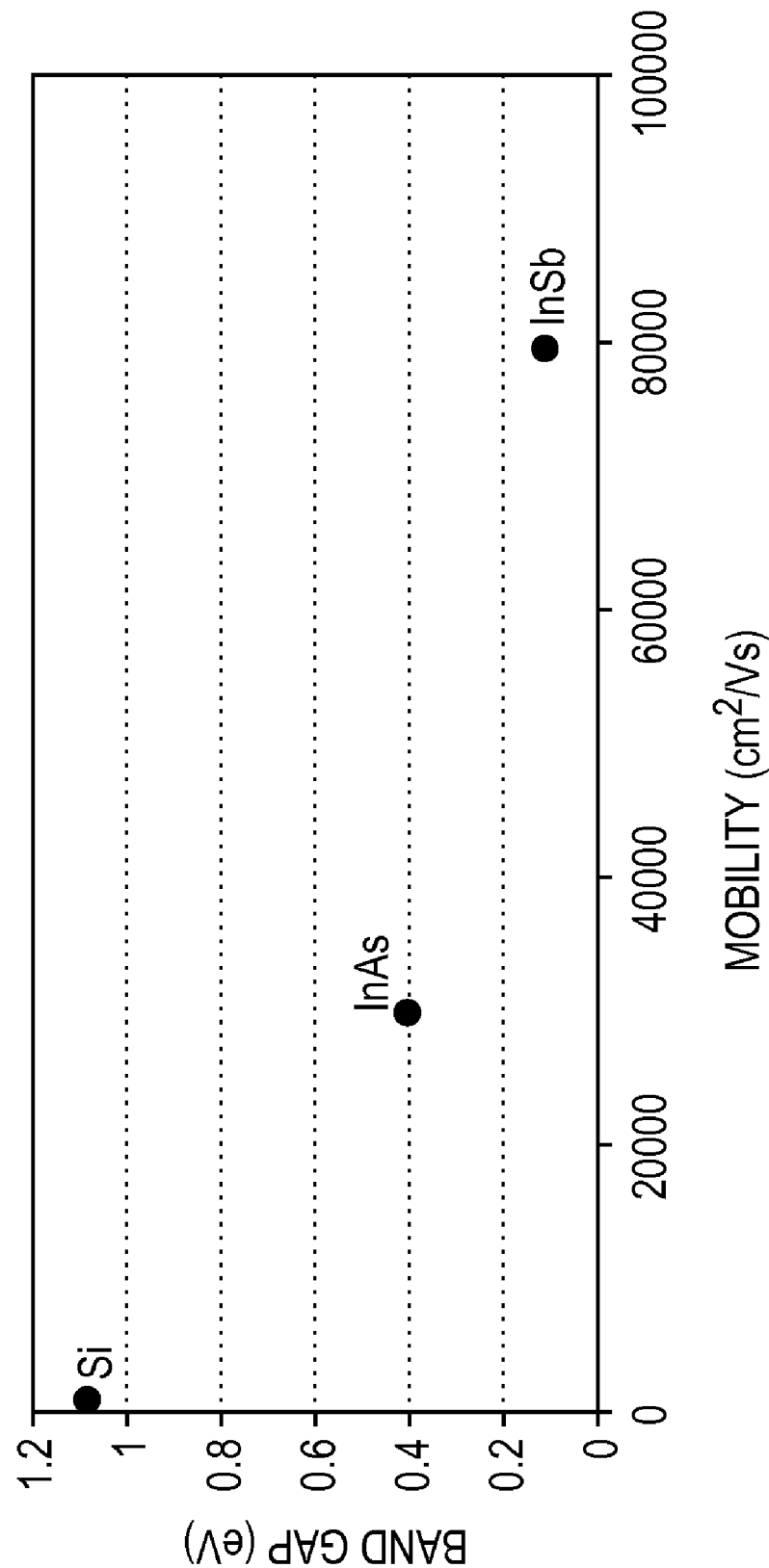
FIG. 12a is a graph representing a correlation between band gap and mobility of several semiconductor materials.
Figure 12B:
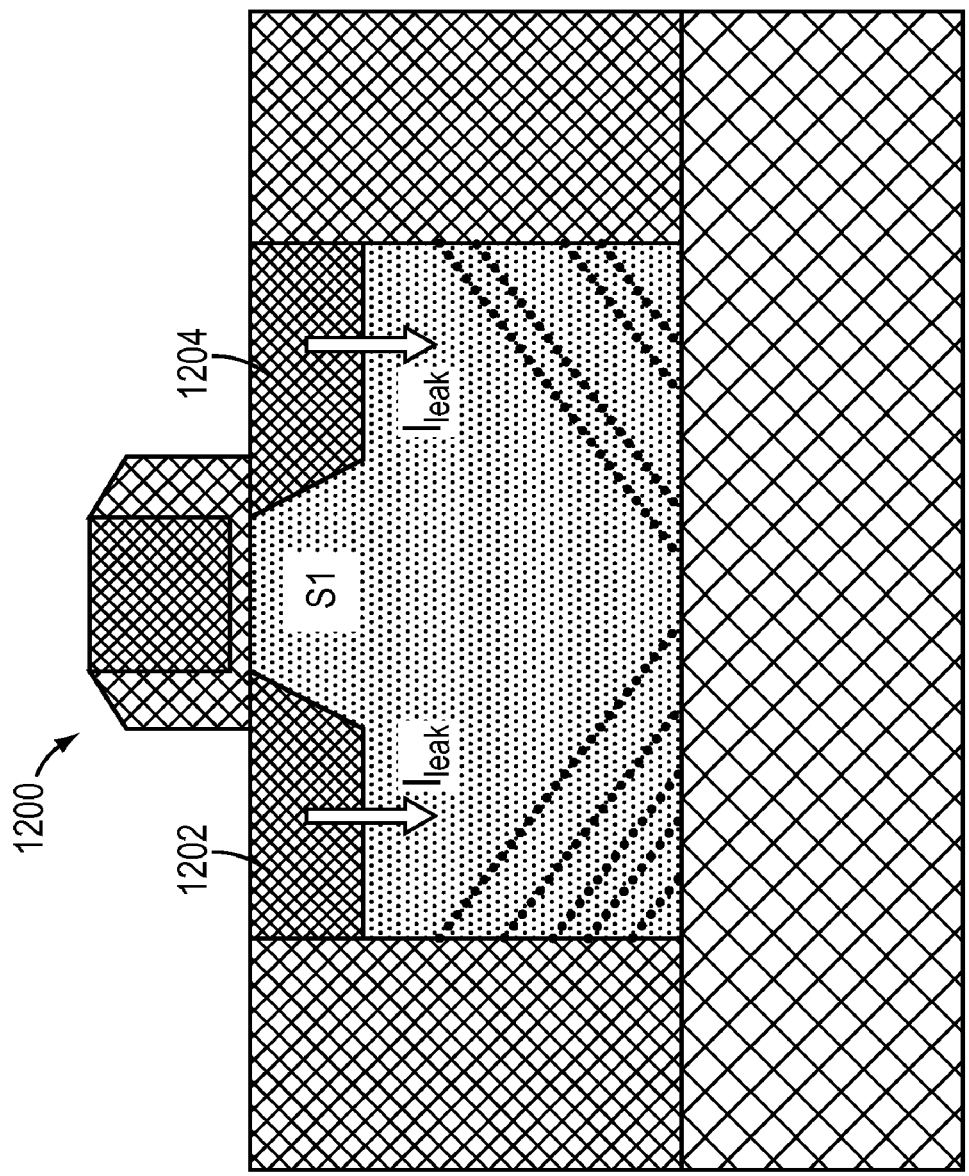
Figure 12C:
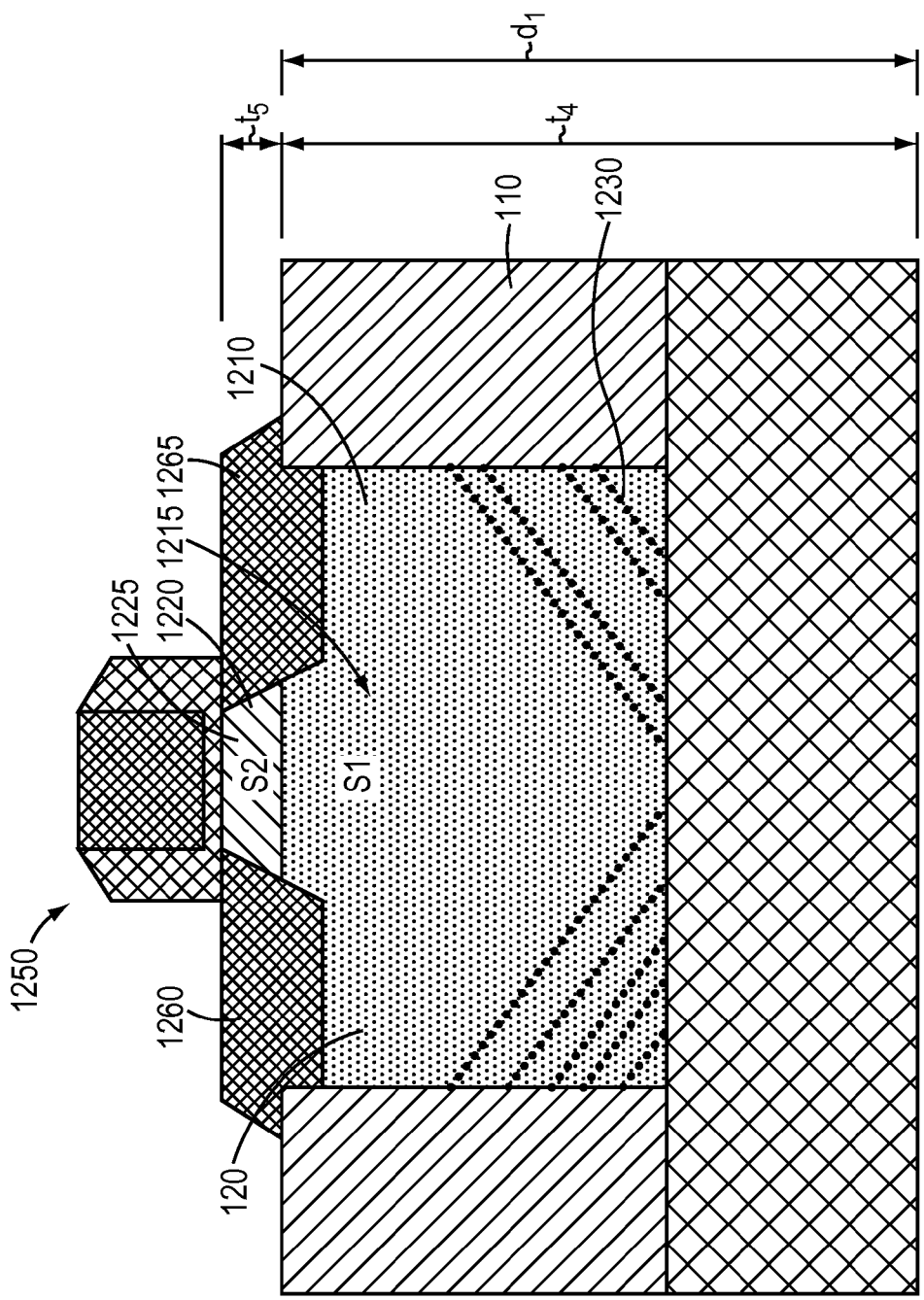

Referring to FIGS. 12*a*-12*c*, two different materials may be deposited in a single active area region to improve device characteristics. Referring to FIG. 12*a*, certain channel materials, e.g., InSb or InAs, may enable high carrier mobility but may also have low band gaps that may cause high source or drain diode leakage. Referring to FIG. 12*b*, a transistor 1200 having an active area including a channel material with a relatively low band gap may be susceptible to high source and/or drain 1202, 1204 leakage. Improved results may be achieved by defining an active area by the selective epitaxy of two active area materials.

Referring to FIG. 12*c*, using a selective epitaxy process analogous to the processes described with reference to FIGS. 1*a*-1*c* and 2*a*-2*g*, a bi-layer structure is defined by the selective epitaxy of a lower active area material layer 1210 in a window 120 defined in the masking layer 110. The lower active area material layer 1210 may include a first semiconductor material 1215 (S1) having a relatively high band gap, such as GaSb, AlSb, CdSe, ZnTe, InAlAs, CdTe, or InAlSb. A thickness $t_4$ of the first active area material 1210 may be equal to depth $d_1$ of the window 120. Thickness $t_4$ and depth $d_1$ may be, for example, selected from a range of, e.g., 200 nm to 500 nm. A planarization step (e.g., CMP) to planarize lower active area material layer 1210 may be performed, so that the top surface of lower active area material layer 1210 and the top surface of masking layer 110 are co-planar. Subsequently, an upper active area material layer 1220 may be formed over the lower active area material layer 1210. The upper active area material layer may include a second semiconductor material 1225 (S2) that provides a high carrier mobility, but may have a low bandgap, such as InAs or InSb. A thickness $t_5$ of the upper active material layer may be, for example, selected from a range of 5 nm to 100 nm. In an embodiment, the lower active area material may be substantially uniform, e.g., ungraded, in composition.

In a preferred embodiment, a lattice mismatch between the first material S1 1215 and the second material S2 1225 is sufficiently small to reduce the formation of defects. The lattice mismatch is preferably less than about 2%. Some possible material combinations are given below in Table 1:

TABLE 1

| S1 and S2 material combinations | | |
| --- | --- | --- |
| S2 | S1 | S1 $E_g$ (eV) |
| InAs | GaSb | 0.8 |
| InAs | AlSb | 1.7 |
| InAs | CdSe | 1.8 |
| InAs | ZnTe | 2.4 |
| InAs | InAlAs | 0.8-1.0 |
| InSb | CdTe | 1.5 |
| InSb | InAlSb | 0.8 |

A device 1250, such as a transistor, may be formed including the lower and upper active area layers 1210, 1220. Bottom portions of source and drain regions 1260, 1265 may be disposed in the lower active area layer 1210, and upper portions of the source and drain regions 1260, 1265 may be disposed in the upper active area layer 1220. Leakage current is thereby reduced while high carrier mobility is provided.

Defects 1230 may form at an interface between the substrate and the semiconducting material S1, due to lattice constant mismatch. These defects may be trapped by sidewalls of the masking layer 110 defining the window 120, as described in U.S. patent application Ser. Nos. 11/436,198 and 11/436,062, Referring to FIGS. 13*a*-13*e*, in some embodiments, selective epitaxy of active area materials may be used to provide channel regions with high strain levels, e.g., ≧1.5%, that may be used in both NMOS and PMOS devices. Masking layer 110 is formed over substrate 100, which includes a crystalline material as described above. The masking layer 110 includes a non-crystalline material, such as a dielectric, e.g., $SiO_2$ or $Si_3N_4$. First opening 710 is defined in the masking layer 110, exposing a first portion 1300 of the substrate 100. First active area material 730, such as Si, is grown by selective epitaxy within the first opening 710. A top portion of the first active area material 730 extending above a top surface of the masking layer 110 may be planarized by, e.g., CMP. Thereafter, a first layer 1310 including second active area material 770 is selectively grown over the first active area material 730. The second active area material 770 may be lattice mismatched to the first active area material 730. For example, $Si_{1-x}Ge_x$ may be formed over relaxed Si, with $x \geq 0.35$. A thickness $t_6$ of the second active area material 770 is preferably less than a thickness leading to gross relaxation. In compressive layers, such as $Si_{1-x}Ge_x$ formed over Si, this relaxation thickness is approximately three to four times a critical thickness $h_c$, i.e., a thickness at which misfit dislocations may start to appear. For example, for x=0.35 the critical thickness at which misfit dislocations may start to appear is approximately 65 nm, so thickness $t_6$ is preferably less than approximately 260 nm.

Each of the first and second active area materials 730, 770 may be formed in the manner discussed above with respect to active area material 140, and may include any of the listed materials. In some embodiments, the first active area material may include at least one of a group IV element or compound, such as Si or Ge or SiGe, or a III-V compound, such as InAs, InGaAs, InSb, AlSb, InAlSb, GaAs, and InP, and the second active area material may include at least one of a group IV element or compound, such as Si or Ge or SiGe, or a III-V compound, such as InAs, InGaAs, InSb, AlSb, InAlSb, GaAs, and InP.

The first portion of the substrate, including first and second active area materials 730, 770, is covered with second masking layer 740. The second masking layer 740 includes a non-crystalline material, such as a dielectric, e.g., $SiO_2$ or $Si_3N_4$. Second opening 750 is defined in the masking layer 110. The second opening 750 is filled with a third active area material 1315, e.g., $Si_{1-x}Ge_x$ with $x \geq 0.35$. A thickness of the third active area material 1315 is preferably greater than a thickness that leads to gross relaxation, such that the third active area material is relaxed. In compressive layers, such as $Si_{1-x}Ge_x$ formed over a Si substrate, this relaxation thickness is approximately three to four times a critical thickness $h_c$, i.e., a thickness at which misfit dislocations may start to appear. For example, for x=0.35 the critical thickness at which misfit dislocations may start to appear is approximately 65 nm, so the thickness of the third active material 1315 is preferably greater than approximately 260 nm. Defects may form at an interface between the second active area material 770 and the substrate 100. These defects may be trapped by sidewalls of the masking material 110 defining the opening 750, as described in U.S. patent application Ser. Nos. 11/436,198 and 11/436,062. A top portion of the third active area material 1315 extending above the top surface of the masking layer 110 may be planarized by, e.g., CMP. Thereafter, a second layer 1320 comprising a fourth active area material 1317, e.g., Si, is selectively grown over the third active area material 1315. A thickness $t_7$ of the fourth active area material 1317 is preferably less than a thickness that leads to gross relaxation. For tensilely strained layers, such as Si disposed over relaxed $Si_{1-x}Ge_x$, the thickness $t_7$ is less than about 10 times the critical thickness $h_c$. For example, for x=0.35, the critical thickness at which misfit dislocations may start to appear is approximately 65 nm, so thickness $t_7$ is preferably less than approximately 650 nm. The second masking layer 740 is removed by, e.g., a selective wet etch.

Each of the third and fourth active area materials 1315, 1317 may be formed in the manner discussed above with respect to active area material 140, and may include any of the listed materials. In some embodiments, the third active area material may include at least one of a group IV element or compound, such as Si or Ge or SiGe, or a III-V compound, such as InAs, InGaAs, InSb, AlSb, InAlSb, GaAs, and InP, and the fourth active area material may include at least one of a group IV element or compound, such as Si or Ge or SiGe, or a III-V compound, such as InAs, InGaAs, InSb, AlSb, InAlSb, GaAs, and InP.

In an embodiment, the first and second active area materials 730, 770 deposited in the first opening 710 may be the same as the fourth and third active area materials 1317, 1315, respectively, deposited in the second opening 750. This will result in equivalent strain levels for, e.g., NMOS and PMOS devices incorporating these active areas. That is, an NMOS and a PMOS device will incorporate strains substantially identical in magnitude but opposite in sign. In a preferred embodiment, Si on SiGe is used for the NMOS regions, and SiGe on Si is used for the PMOS regions, thus providing the beneficial sign of strain for both NMOS and PMOS regions. Other combinations of materials are possible. Based on the observation that tensile strain typically helps electron mobility (be it in Si, SiGe, and perhaps even SiC) and compressive strain (in the direction of current flow) typically helps PMOS mobility (be it in Si or SiGe), a guideline for material selection may be that for the NMOS case the natural lattice constant of the channel material is preferably smaller than the semiconductor below, and vice versa for PMOS. Preferably, for both the NMOS and PMOS cases, the lower active area material is substantially relaxed, such that the upper active area material is strained.

Figure 13C:
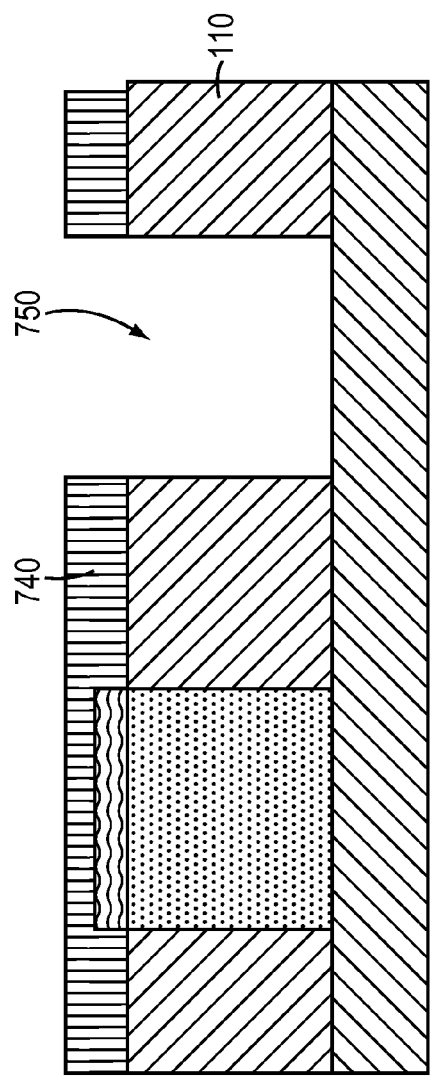
Figure 13D:
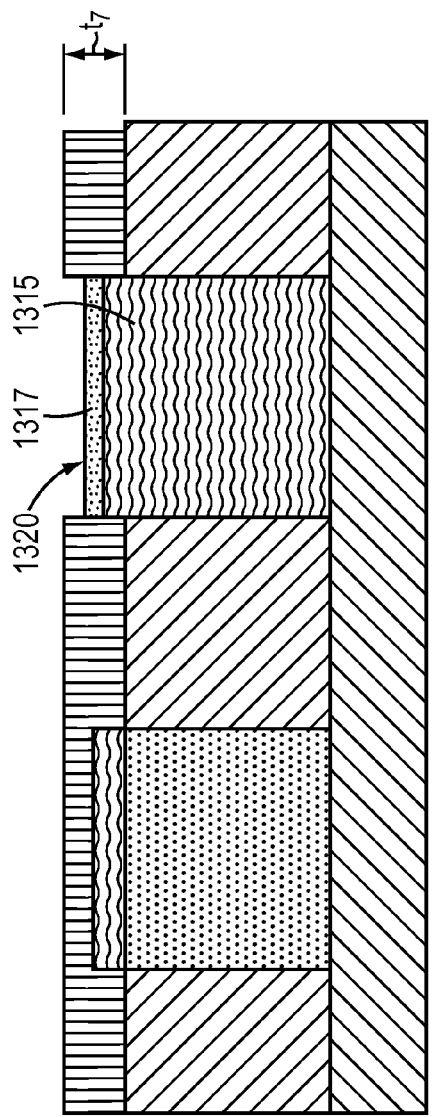
Figure 13E:
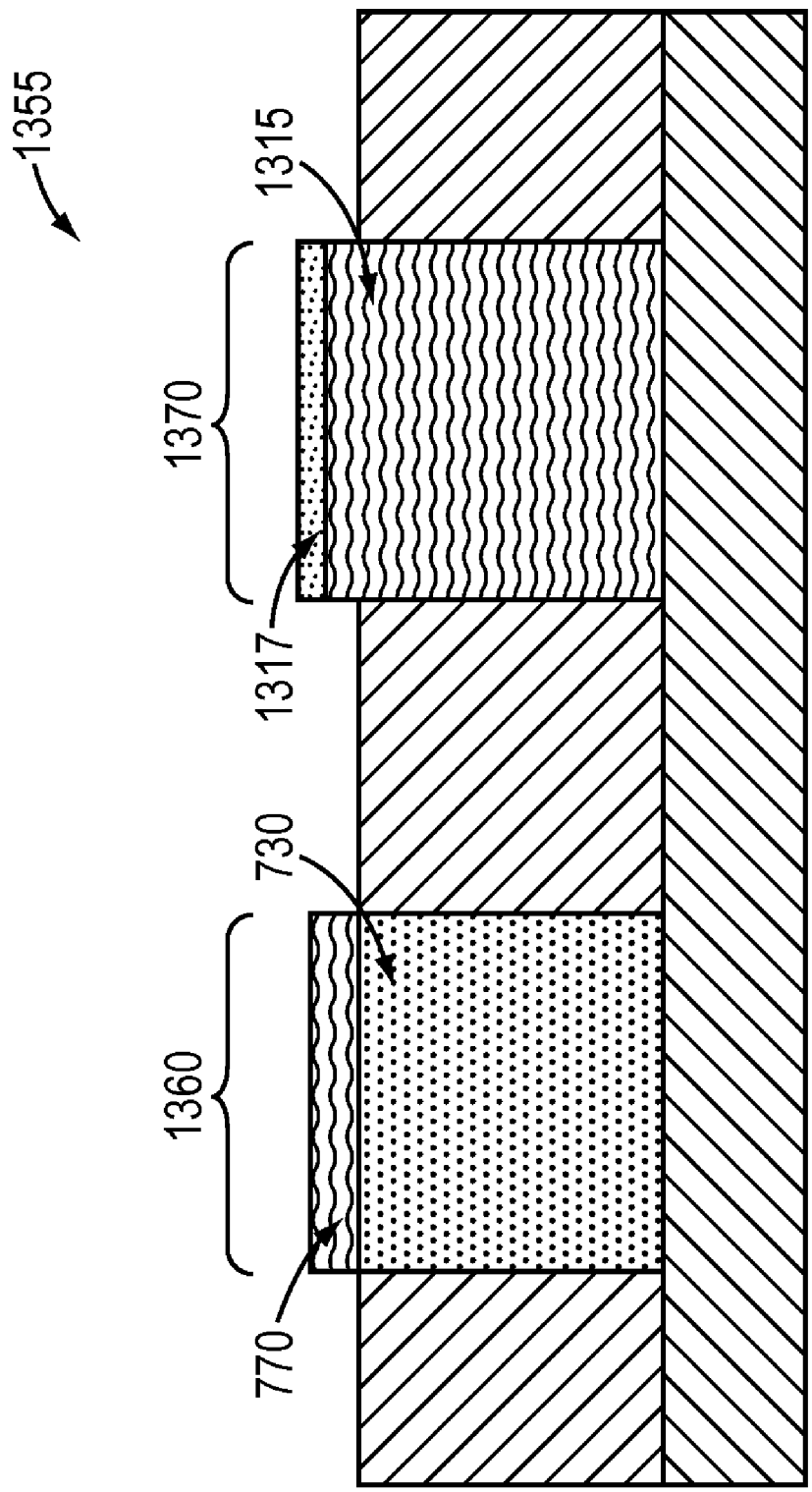

Referring to FIG. 13e, a resulting structure 1355 includes first and second active areas 1360, 1370. The first active area 1360 may be suitable for formation of a PMOS device. It may include second active area material 770, e.g., highly compressively strained $Si_{1-x}Ge_x$, disposed over first active area material 730, e.g., Si. The highly compressively strained material may enhance PMOS device performance by providing high hole mobility. The second active area 1370 may be suitable for formation of an NMOS device. It may include fourth active area material 1317, e.g., highly tensilely strained Si, disposed over third active area material 1315, e.g., relaxed $Si_{1-x}Ge_x$. The highly tensilely strained material may enhance NMOS device performance by providing high electron mobility.

Figure 13F:
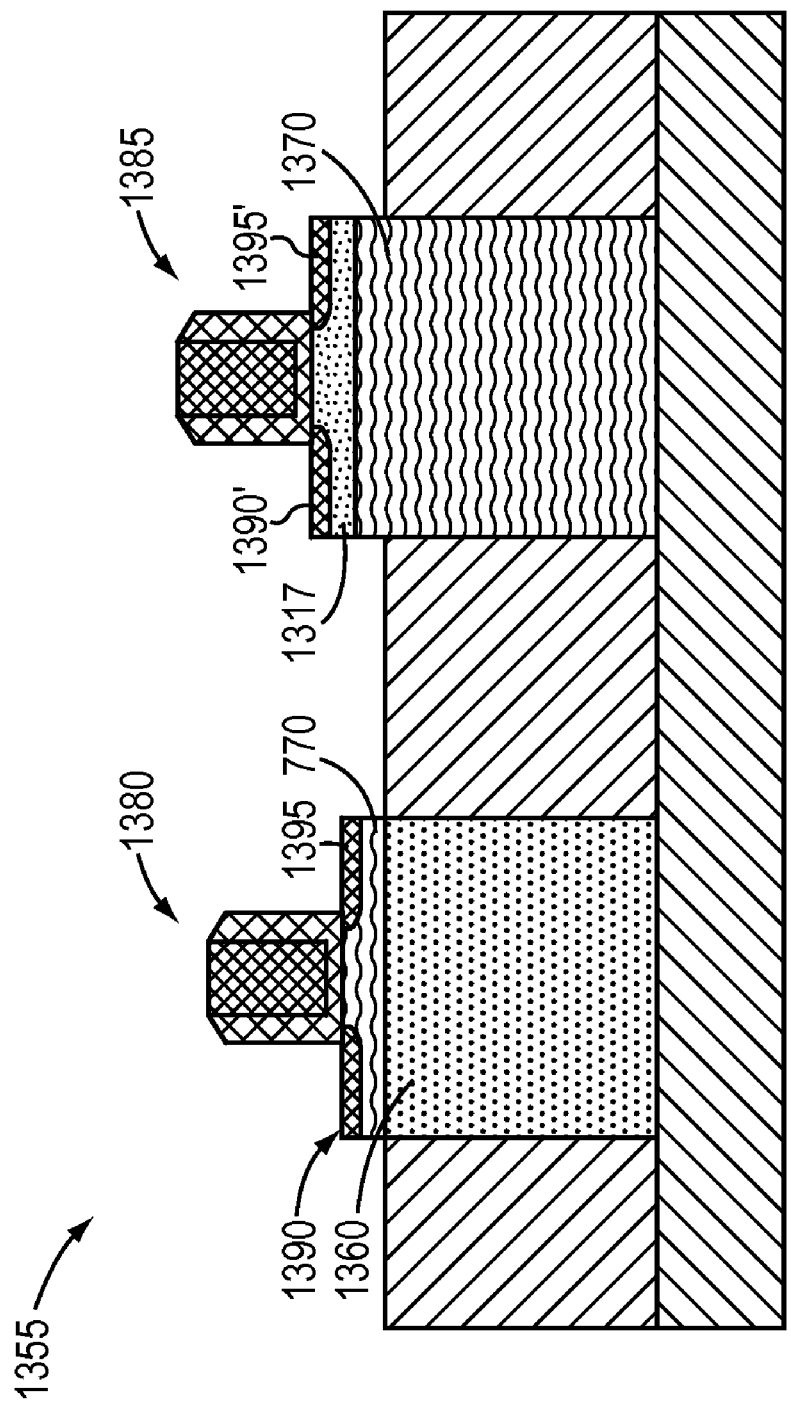

Referring to FIG. 13f, PMOS and NMOS transistors 1380, 1385 are formed over first and second active areas 1360, 1370 of the structure 1355. In an embodiment, the PMOS and NMOS transistors may have shallow source and drain regions 1390, 1390', 1395, 1395' disposed entirely in the upper active area materials, i.e., second active area material 770 and fourth active area material 1317, respectively. Thus, the source and drain regions do not intersect an interface between two epitaxial layers, that may include misfit dislocations that may lead to severe, unacceptable leakage.

Figure 13G:
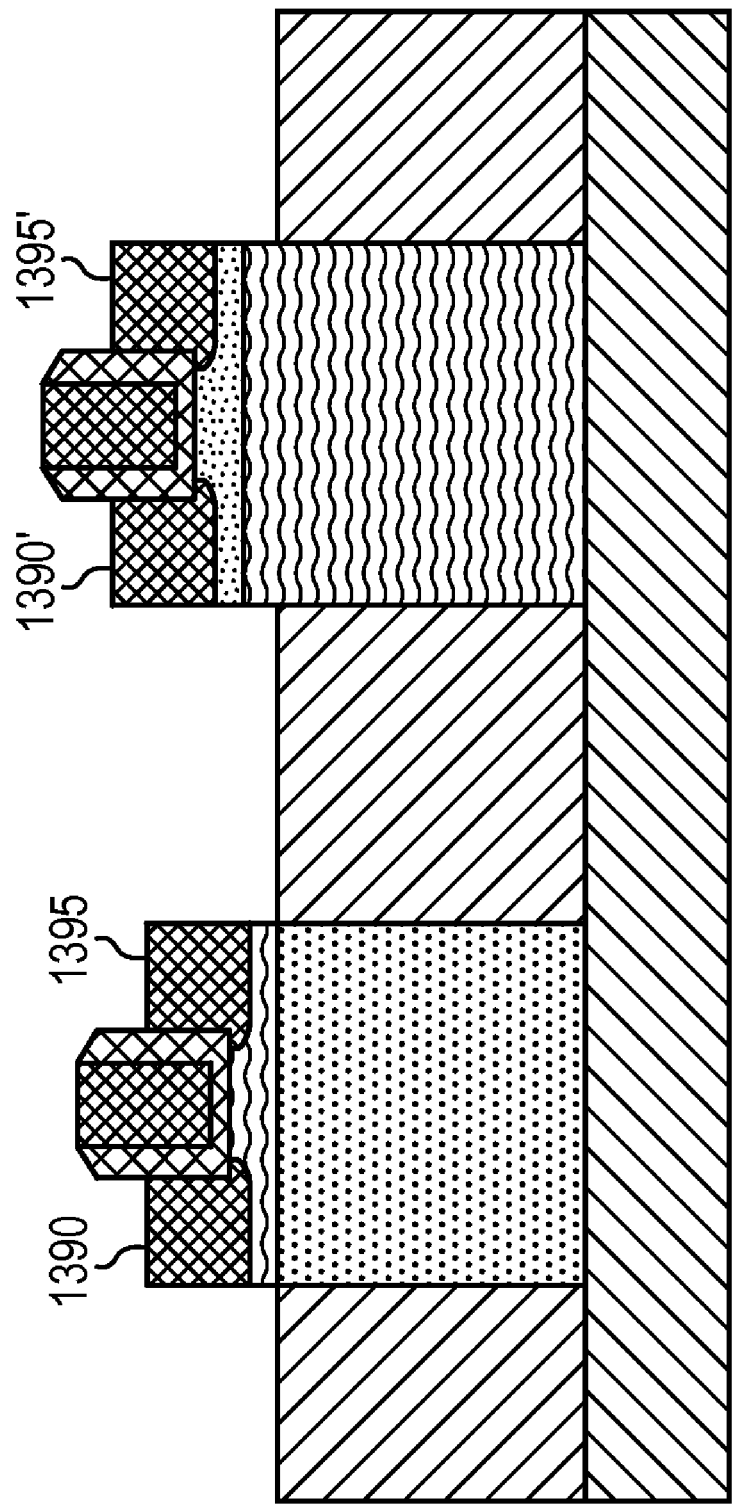

Referring to FIG. 13g, the source and drain regions 1390, 1390', 1395, 1395' may include silicide material, thereby enhancing source and drain contacts. The source and drain regions may be thickened by selective epitaxy. In an embodiment, the PMOS source and drain regions may include $Si_{1-x}Ge_x$ and the NMOS source and drain regions may include Si, thereby enhancing the respective device performances.

In all of the structures and devices discussed above, a non-uniform doping profile may be formed during the epitaxy of the layers. This doping profile may preferably have a lower concentration of dopants in a top portion of the layer(s).

The invention may be embodied in other specific forms without departing from the spirit or essential characteristics thereof. The foregoing embodiments are therefore to be considered in all respects illustrative rather than limiting on the invention described herein. Scope of the invention is thus indicated by the appended claims rather than by the foregoing description, and all changes which come within the meaning and range of equivalency of the claims are intended to be embraced therein.

What is claimed is:

1. A structure comprising:
    a first shallow trench isolation region having a first width and defining a first opening in a substrate, the first opening having at least a first pair of sidewalls defined by the first shallow trench isolation region;
    a first active area comprising a first active area material disposed within and filling the first opening, the first active area being surrounded by and in contact with the first shallow trench isolation region;
    a second shallow trench isolation region having a second width and defining a second opening in the substrate, the second opening having at least a second pair of sidewalls defined by the second shallow trench isolation region; and
    a second active area comprising a second active area material disposed within and filling the second opening, the second active area being surrounded by and in contact with the second shallow trench isolation region,
    wherein a ratio of the first width to the second width is greater than 1 and the first active area material is a semiconductor selected from the group consisting of Ge, SiGe, SiC, diamond, III-V semiconductors, and II-VI semiconductors.

2. The structure of claim 1, wherein the second active area material comprises Si.

3. The structure of claim 1, wherein the first active area material has a first crystalline orientation and the second active area material has a second crystalline orientation different from the first crystalline orientation.

4. The structure of claim 1, wherein the ratio of the first width to the second width is selected from a range of 1.2 to 3.

5. The structure of claim 1, wherein the first active area material is different from the second active area material.

6. The structure of claim 1, wherein the substrate comprises a substrate material different from the first active area material.

7. The structure of claim 6, wherein the substrate material is different from the second active area material.

8. The structure of claim 1, wherein the second area material is a semiconductor selected from the group consisting of Ge, SiGe, SiC, diamond, III-V semiconductors, and II-VI semiconductors.

9. The structure of claim 1, wherein the substrate comprises silicon.

10. The structure of claim 1, wherein the substrate comprises germanium.

11. The structure of claim 1, wherein the substrate comprises an insulator layer.

12. The structure of claim 8, wherein the substrate comprises silicon.

13. The structure of claim 8, wherein the substrate comprises germanium.

14. The structure of claim 8, wherein the substrate comprises an insulator layer.

* * * * *